United States Patent
Barry et al.

(10) Patent No.: US 11,774,520 B2
(45) Date of Patent: Oct. 3, 2023

(54) FERRIMAGNETIC OSCILLATOR MAGNETOMETER

(71) Applicant: Massachusetts Institute of Technology, Cambridge, MA (US)

(72) Inventors: John F. Barry, Arlington, MA (US); Reed Anderson Irion, Belmont, MA (US); Jessica Kedziora, Shirley, MA (US); Matthew Steinecker, Medford, MA (US); Daniel K. Freeman, Reading, MA (US); Danielle A. Braje, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 118 days.

(21) Appl. No.: 17/317,983

(22) Filed: May 12, 2021

(65) Prior Publication Data

US 2022/0011383 A1    Jan. 13, 2022

Related U.S. Application Data

(60) Provisional application No. 63/050,832, filed on Jul. 12, 2020.

(51) Int. Cl.
| | | |
|---|---|---|
| G01R 33/02 | (2006.01) | |
| G06F 3/046 | (2006.01) | |
| H03B 15/00 | (2006.01) | |

(52) U.S. Cl.
CPC ............ *G01R 33/02* (2013.01); *G06F 3/046* (2013.01); *H03B 15/006* (2013.01)

(58) Field of Classification Search
CPC .. G01R 33/02; G01R 33/022; G01R 33/1284; G01R 33/24; G06F 3/046; H03B 15/006
See application file for complete search history.

(56) References Cited

U.S. PATENT DOCUMENTS 10,809,322 B1 * 10/2020 Wang ..................... H04B 10/00
2007/0247147 A1    10/2007 Xiang et al.
(Continued)

FOREIGN PATENT DOCUMENTS

WO    2009073736 A1    6/2009

OTHER PUBLICATIONS

STIC Application search 2022.*
(Continued)

*Primary Examiner* — Feba Pothen
*Assistant Examiner* — Brent J Andrews
(74) *Attorney, Agent, or Firm* — Smith Baluch LLP

(57) ABSTRACT

Ferrimagnetic oscillator magnetometers do not use lasers to stimulate fluorescence emission from defect centers in solid-state hosts (e.g., nitrogen vacancies in diamonds). Instead, in a ferrimagnetic oscillator magnetometer, the applied magnetic field shifts the resonance of entangled electronic spins in a ferrimagnetic crystal. These spins are entangled and can have an ensemble resonance linewidth of approximately 370 kHz to 10 MHz. The resonance shift produces microwave sidebands with amplitudes proportional to the magnetic field strength at frequencies proportional to the magnetic field oscillation frequency. These sidebands can be coherently averaged, digitized, and coherently processed, yielding magnetic field measurements with sensitivities possibly approaching the spin projection limit of 1 attotesla/$\sqrt{Hz}$. The encoding of magnetic signals in frequency rather than amplitude relaxes or removes otherwise stringent requires on the digitizer.

12 Claims, 17 Drawing Sheets

(56) References Cited

U.S. PATENT DOCUMENTS

2018/0136291 A1 5/2018 Pham et al.
2021/0263117 A1* 8/2021 Braje .................. G01R 33/24

OTHER PUBLICATIONS

Balynsky et al., "A magnetometer based on a spin wave interferometer." Scientific Reports 7.1 (2017): 1-11.
Beaumont et al., "Ferrimagnetic resonance field sensors for particle accelerators." Review of Scientific Instruments 90.6 (2019): 065005 10 pages.
Beaumont et al., Electron spin resonance magnetic field sensors for the B-Train systems. CERN MSC Seminar Presentation Jan. 9, 2020. 42 pages.
Carpenter et al., "Phase-locked yttrium iron garnet magnetometer for remote measurement of small field changes in a fluctuating background." Review of Scientific Instruments 53.9 (1982): 1414-1417.
Doriath et al., "A sensitive and compact magnetometer using Faraday effect in YIG waveguide." Journal of Applied Physics 53.11 (1982): 8263-8265.
Inoue et al., "Investigating the use of magnonic crystals as extremely sensitive magnetic field sensors at room temperature." Applied Physics Letters 98.13 (2011): 132511. 4 pages.
Kaya et al., "YIG film for magnetic field sensor." Acta Physica Polonica A 127.4 (2015): 937-939.
Koda et al., "Highly Sensitive Magnetic Field Sensing Using Magnetization Dynamics in Yttrium Iron Garnet Single-Crystal Thin Films." IEEE Transactions on Magnetics 55.7 (2019): 1-4.
Nikitin, High Sensitivity Magnetometers "Sensors and Applications." International Scientific School Conference Nov. 4-8, 2002 8 pages.
U.S. Appl. No. 17/134,589, filed Dec. 28, 2020.
Vetoshko et al., "Epitaxial yttrium iron garnet film as an active medium of an even-harmonic magnetic field transducer." Sensors and Actuators A: Physical 106.1-3 (2003): 270-273.
International Search Report and Written Opinion dated Mar. 17, 2022 International Application No. PCT/US2021/031911. 14 pages.

* cited by examiner

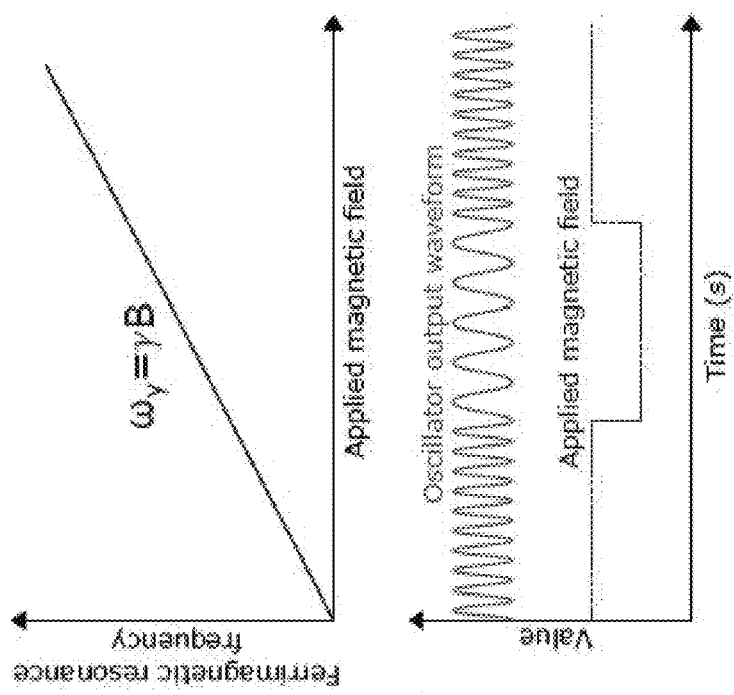
FIG. 2B
FIG. 2C
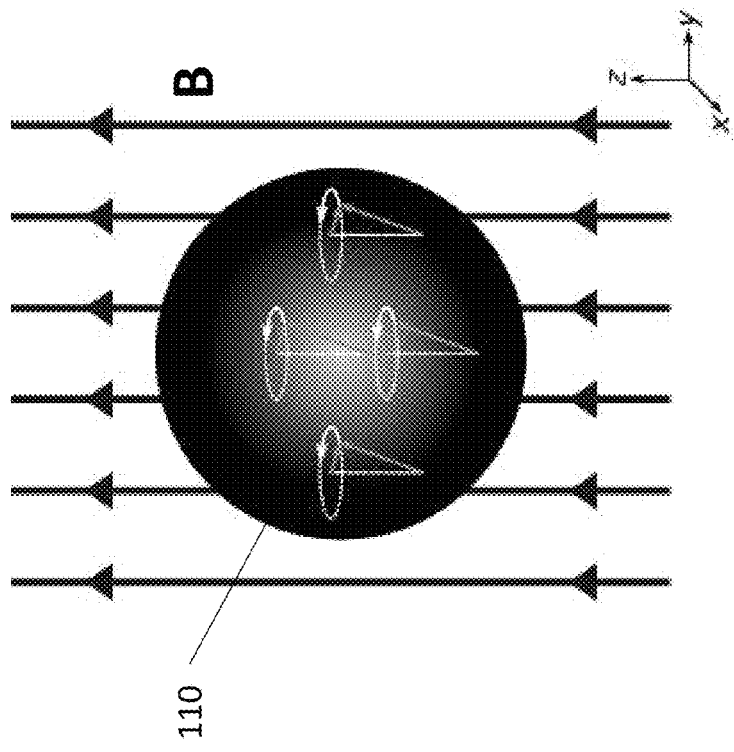
FIG. 2A

FERRIMAGNETIC OSCILLATOR MAGNETOMETER

CROSS-REFERENCE TO RELATED APPLICATION(S)

This application claims the priority benefit, under 35 U.S.C. 119(e), of U.S. Application No. 63/050,832, filed on Jul. 12, 2020, which is incorporated herein by reference in its entirety for all purposes.

GOVERNMENT SUPPORT

This invention was made with government support under FA8702-15-D-0001 awarded by the U.S. Air Force. The government has certain rights in the invention.

BACKGROUND

In recent years, tremendous experimental effort has been dedicated to the development of quantum sensors employing unpaired electron spins embedded in solid-state crystals. These solid-state sensors employ electron paramagnetic resonances to offer measurement precision and accuracy comparable to their atomic counterparts, with substantial advantages such as sensor size, compatibility over a wide range of ambient conditions, and a rigid crystal lattice providing fixed sensing axes. The most-developed solid-state quantum sensing platform uses negatively charged nitrogen-vacancy (NV) centers in diamond as sensitive probes of magnetic field. Such sensors have been employed for detection or imaging of biological targets, single proteins, nuclear magnetic resonance (NMR) species, individual spins, and condensed matter phenomena.

Although NV centers in diamond offer important advantages as a quantum sensing platform, including some of the longest coherence times of any paramagnetic defect in a solid-state material, several barriers exist to realizing their full capabilities. Despite sustained effort, high-fidelity state readout of NV ensemble sensors remains challenging. Additionally, the high-intensity optical light used to initialize NVs into a single quantum state (e.g., 100 kW/cm$^2$) can result in both prohibitively large optical powers and thermal dissipation challenges for mm$^3$-scale ensembles. Finally, various technical obstacles, such as challenges in growing optimized diamond material and miniaturizing optical and microwave components, should be addressed before NV$^-$ based devices can be widely employed outside of laboratory environments.

SUMMARY

Though recent efforts have focused on optically active paramagnetic defects, ferrimagnetic and ferromagnetic materials can offer distinct advantages for quantum sensors. In a ferromagnetic material, adjacent spin magnetic moments are aligned parallel to each other, resulting in spontaneous magnetization even in the absence of an ambient magnetic field, unlike in paramagnetic materials. In a ferrimagnetic material, adjacent spin magnetic moments are aligned anti-parallel to each other, but do not completely cancel each other. This also results in a spontaneous magnetization even in the absence of an ambient magnetic field. Ferrimagnetic and ferromagnetic materials can provide much higher spin densities than their paramagnetic counterparts (e.g., $\sim 10^{22}$ cm$^{-3}$ vs. $\sim 10^{16}$-$10^{19}$ cm$^{-3}$) while the strong coupling of the exchange interaction mitigates the dipolar resonance broadening often observed in high-defect-density paramagnetic materials. In addition, ferromagnetic or ferrimagnetic materials can be passively initialized into the desired quantum state by application of a bias magnetic field rather than actively initialized with light.

A magnetometer can use a ferrimagnetic (or ferromagnetic) material as a magnetically sensitive filter component in an oscillator loop. The ferrimagnetic material acts as a notch or passband filter whose resonance or center frequency varies with the externally applied magnetic field. When coupled to a gain component, such as a sustaining amplifier, in a transmission geometry, the ferrimagnetic filter can sustain an oscillating voltage at the resonance frequency. The amplitude, phase, and frequency of the external magnetic field sensed by the ferro/ferrimagnetic oscillator magnetometer can be encoded in the frequency modulation of the oscillator output voltage, in an error signal fed back to the oscillator to keep the oscillator locked to the ferrimagnetic resonance, or in a combination of both. Other geometries are also possible; for example, the oscillator can be implemented as a Pound-Galani oscillator where reflection from the ferromagnetic material is used to lock the oscillator frequency to the ferro/ferrimagnetic resonance and transmission through the ferro/ferrimagnetic material is used to sustain the oscillation.

A ferrimagnetic oscillator magnetometer can achieve a sensitivity of as low as 140 fT/$\sqrt{Hz}$, with sensitivity below 300 fT/$\sqrt{Hz}$ over a broad range of frequencies (e.g., about 10 kHz to about 1 MHz). In addition, the sensor head can be small (e.g., the sensor volume can be about one cubic inch or less), rugged, robust to vibration, and simple to make. It uses microwave components and can be fabricated lithographically, with the ferrimagnetic crystal formed using inexpensive sputtering (ferrimagnetic Yttrium Iron Garnet (YIG) forms a single crystal when sputtered). It does not require a laser, photodetector, or external microwave source, so its power consumption can be much lower than other quantum magnetometers of comparable sensitivity. It can operate at room temperature and without calibration.

An example magnetometer may include a ferrimagnetic crystal, a sustaining amplifier in electrical communication with the ferrimagnetic crystal, and a digitizer in electrical communication with the sustaining amplifier and/or the ferrimagnetic crystal. The ferrimagnetic crystal includes an ensemble of entangled electronic spins with a resonance that shifts in response to an external magnetic field. In operation, the sustaining amplifier amplifies a microwave signal modulated by a shift in the resonance of the ensemble of entangled electronic spins. And the digitizer digitizes the microwave signal.

The ferrimagnetic crystal, which may include the entangled electronic spins, and the sustaining amplifier, which may include a bipolar junction transistor, can be connected in a transmission geometry or a reflection geometry. The magnetometer may also include a bandpass filter, in electromagnetic communication with an input of the sustaining amplifier, to filter the microwave signal. And it can include a bias magnet, in electromagnetic communication with the ferrimagnetic crystal, to apply a bias magnetic field to the ensemble of entangled electronic spins.

The shift in the resonance can vary linearly with an amplitude of the external magnetic field. It can modulate sidebands onto the microwave signal with amplitudes proportional to an amplitude of the external magnetic field at offset frequencies proportional to an oscillation frequency of the external magnetic field. In this case, the magnetometer may have a sensitivity versus the oscillation frequency of the external magnetic field that is substantially constant for $f_c < f_m < f_L$, where $f_m$ is the oscillation frequency of the external magnetic field, $f_c$ is an observed noise corner of the sustaining amplifier, and $f_L$ is the Leeson frequency of the magnetometer.

The magnetometer may also include input and output coupling loops that are inductively coupled to the ferrimagnetic crystal and couple the microwave signal into and out of the ferrimagnetic crystal, respectively. The magnetometer may also include a directional coupler with at least three ports: (1) an input port coupled to the output coupling loop, (2) a through port coupled to an input of the sustaining amplifier, and (3) a tap port coupled to the digitizer. Alternatively, or in addition, the magnetometer may include a feedback loop, in electromagnetic communication with the ferrimagnetic crystal and the sustaining amplifier, to generate and apply an error signal correcting an error between a frequency of the microwave signal and a center frequency of the resonance.

A self-sustaining oscillator comprising a ferrimagnetic material that exhibits a ferrimagnetic resonance and is operably coupled to a sustaining amplifier can sense an alternating current (AC) magnetic field as follows. The AC magnetic field is applied to the ferrimagnetic material, which may be subject to a bias magnetic field, thereby shifting a center frequency of the ferrimagnetic resonance exhibited by the ferrimagnetic material and modulating a microwave oscillation supported by the self-sustaining oscillator. While the AC magnetic field is applied to the ferrimagnetic material, the sustaining amplifier amplifies the microwave oscillation transmitted by the ferrimagnetic resonance. The amplitude and/or a frequency of the AC magnetic field can be determined based on the modulation of the microwave oscillation.

Modulating the microwave oscillation can produce sidebands with amplitudes proportional to an amplitude of the external magnetic field at frequencies proportional to an oscillation frequency of the external magnetic field. If so, the amplitude and/or the frequency of the AC magnitude field magnetometer can be determined with a sensitivity versus the oscillation frequency of the external magnetic field that is substantially constant for $f_c < f_m < f_L$, where $f_m$ is the oscillation frequency of the external magnetic field, $f_c$ is an observed noise corner of the sustaining amplifier, and $f_L$ is the Leeson frequency of the magnetometer.

Determining the amplitude and/or the frequency of the AC magnetic field may include measuring a real component of the microwave oscillation, reconstructing a complex representation of the microwave oscillation from the real component of the microwave oscillation, determining a phase angle of the microwave oscillation as a function of time based on the complex representation, and determining the AC magnetic field based on the phase angle. Determining the amplitude and/or the frequency of the AC magnetic field can also include coherently averaging a digital representation of the microwave oscillation.

In some cases, a feedback loop generates an error signal correcting an error between a frequency of the microwave oscillation and a center frequency of the resonance. A servo corrects the error based on the error signal.

Two ferrimagnetic oscillator magnetometers can be coupled to form a gradiometer. The first ferrimagnetic oscillator magnetometer generates a first signal representing an amplitude, frequency, and phase of an external magnetic field at a first location, and the second ferromagnetic oscillator magnetometer generates a second signal representing an amplitude, frequency, and phase of the external magnetic field at a second location. A mixer, which is operably coupled to the first and second ferrimagnetic oscillator magnetometers, mixes the first signal with the second signal, thereby producing a beat signal representing a gradient of the external magnetic field.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., elements that are functionally and/or structurally similar).

FIG. 2A illustrates how the spins of a ferrimagnetic sphere precess in phase in the presence of a uniform external magnetic field.

FIG. 2B is a plot of the spin precession frequency of the uniform ferrimagnetic resonance mode versus applied magnetic field.

FIG. 2C is a plot showing the oscillation frequency of (top) and magnetic field applied to (bottom) a ferrimagnetic oscillator magnetometer with a ferrimagnetic resonance employed as a frequency discriminator.

Figure 1A:
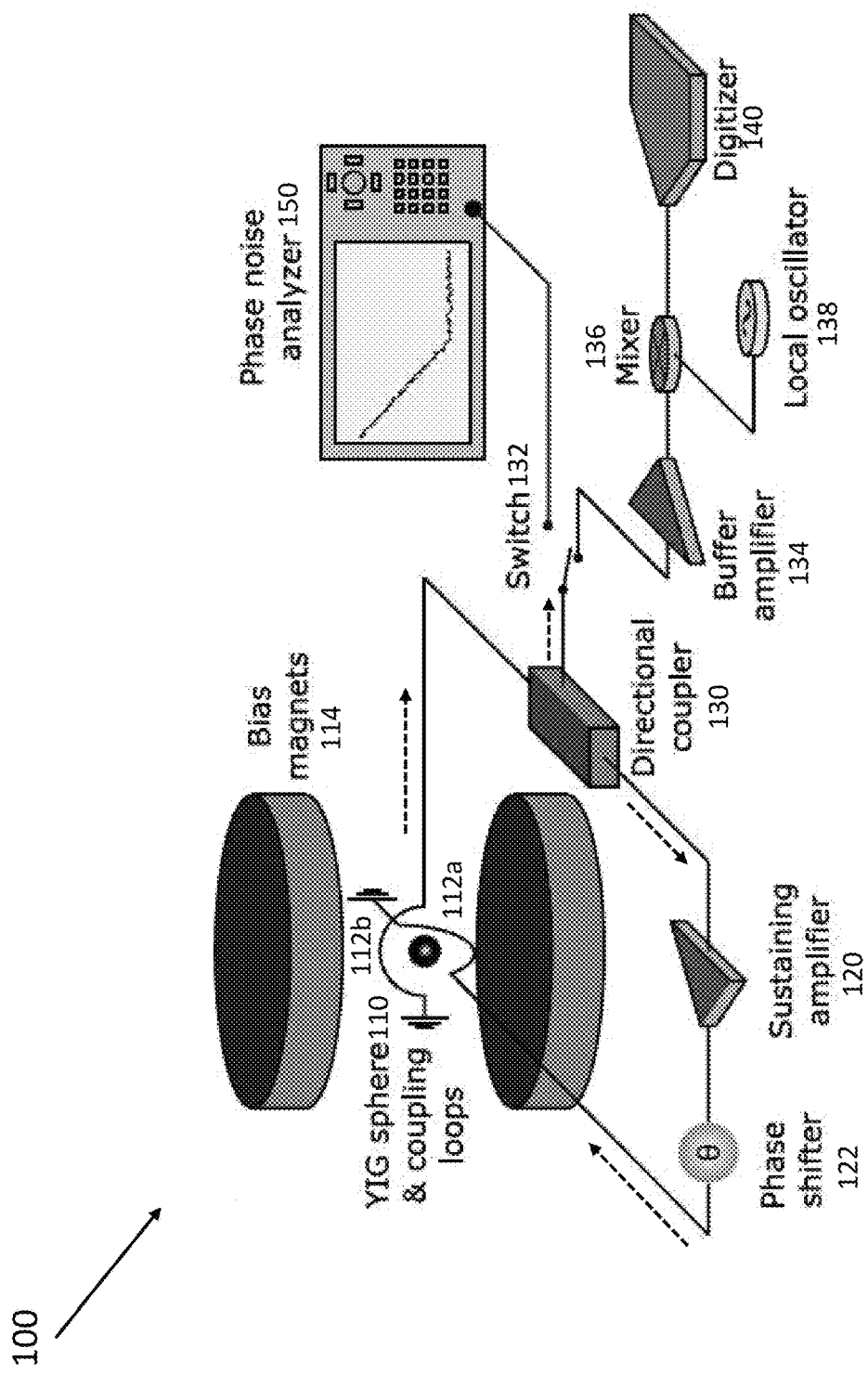
FIG. 1A shows a ferrimagnetic oscillator magnetometer with a free-running transmission geometry.
Figures 4A, 4B, 4C:
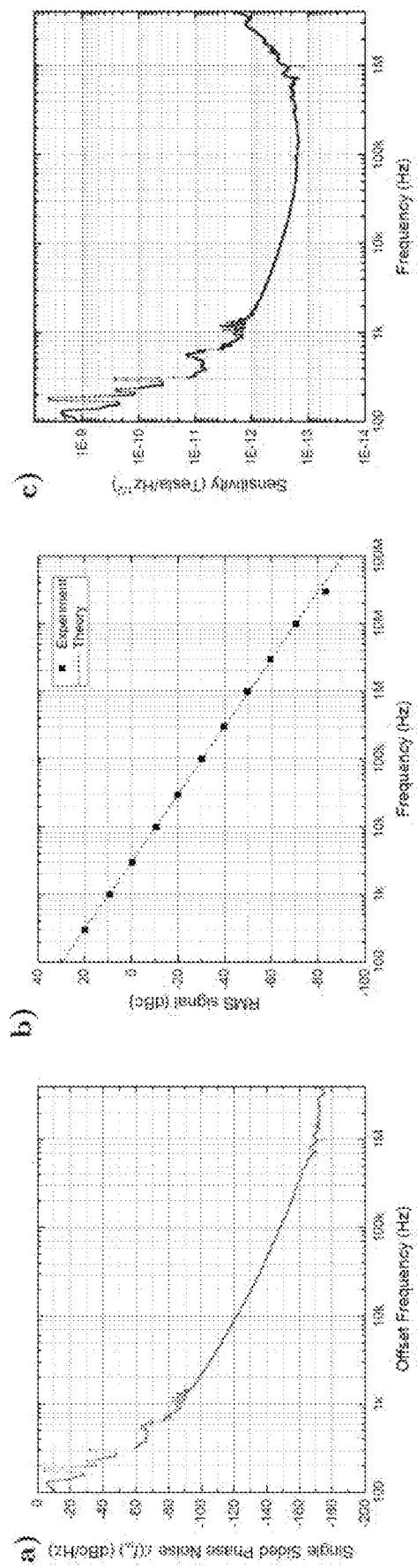
FIG. 4A shows the single-sideband phase-noise power spectral density of the ferrimagnetic oscillator magnetometer of FIG. 1A. The single-sideband phase-noise is −122.5 dBc/Hz and −148.5 dBc/Hz at 10 kHz and 100 kHz offsets from the carrier, respectively.
FIG. 4B shows the predicted and measured frequency response of the ferrimagnetic oscillator magnetometer of FIG. 1A to a 150 nT rms AC magnetic field applied along the 2 axis.

FIG. 4C is a plot of the sensitivity versus frequency of the ferrimagnetic oscillator magnetometer of FIG. 1A. The device achieves a minimum sensitivity of 140 T/√Hz to AC magnetic fields of known phase at frequencies near 100 kHz. The sensitivity is below 300 fT/√Hz over the band from 10 kHz to 1 MHz.

Figure 5A:
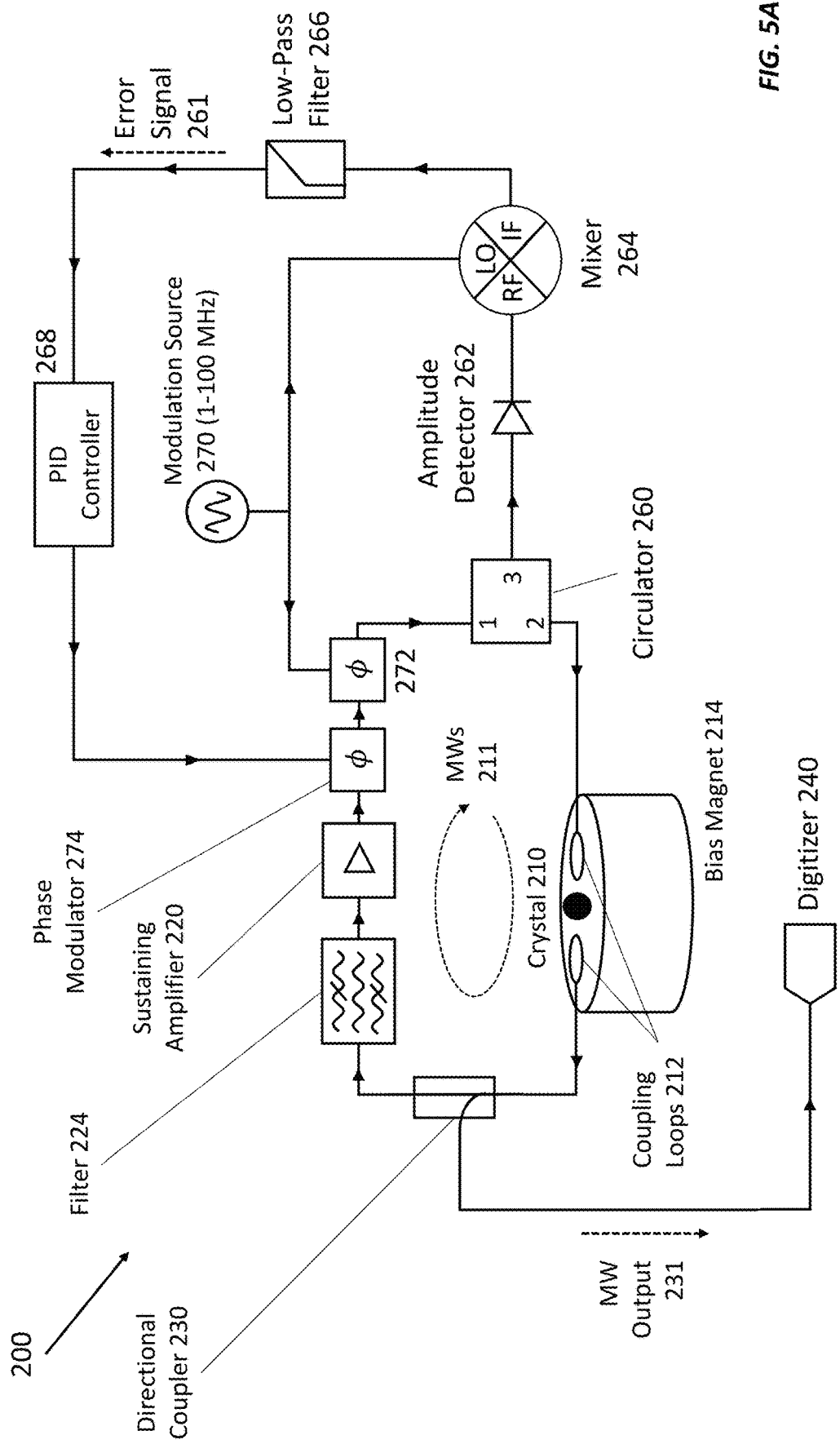

FIG. 5A shows a ferrimagnetic oscillator magnetometer with a Pound-Galani architecture.

Figure 5B:
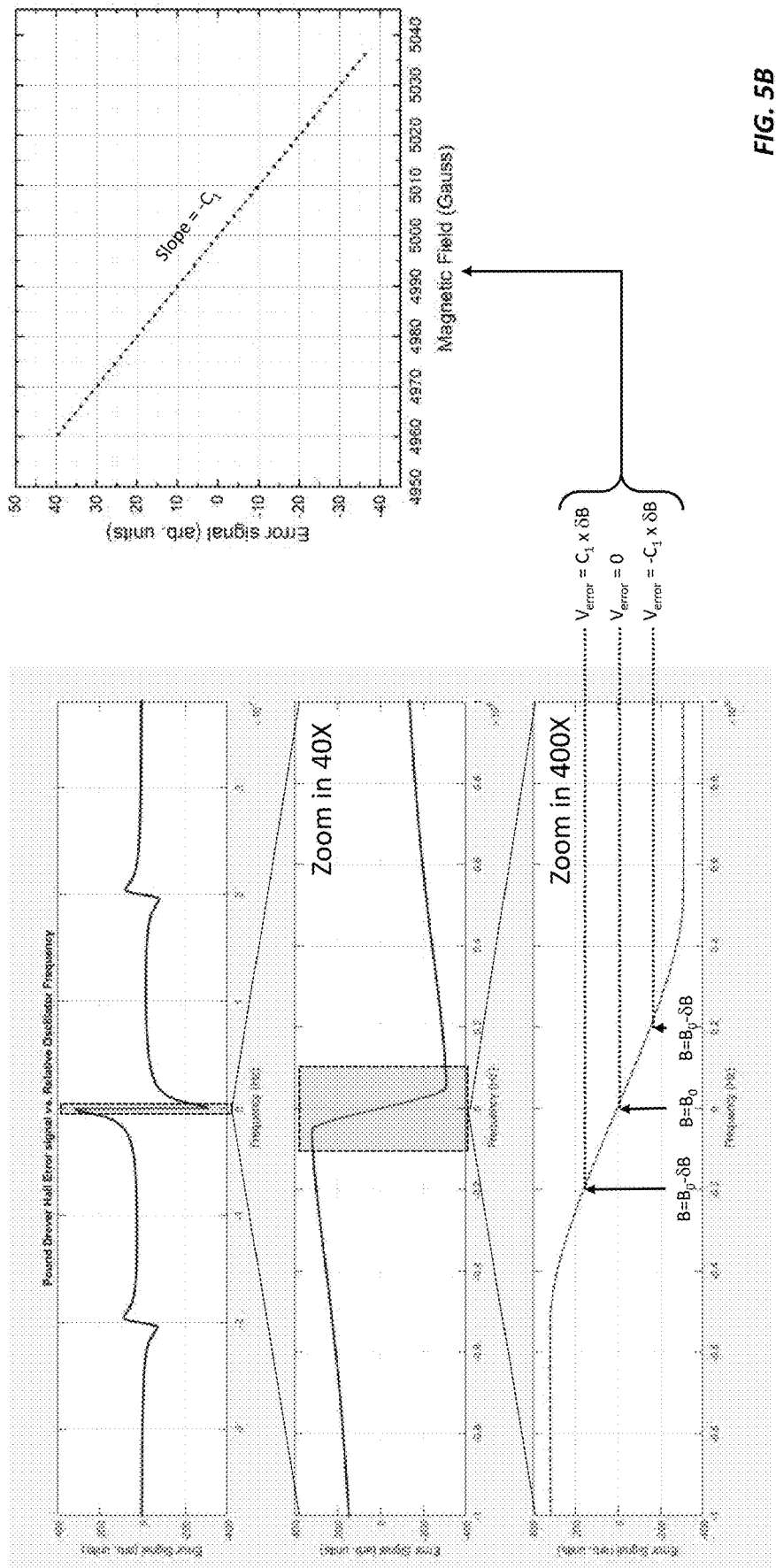

FIG. 5B shows how the magnetic field amplitude is encoded in the Pound-Drever-Hall (PDH) error signal in the ferrimagnetic oscillator magnetometer of FIG. 5A.

Figure 6A:
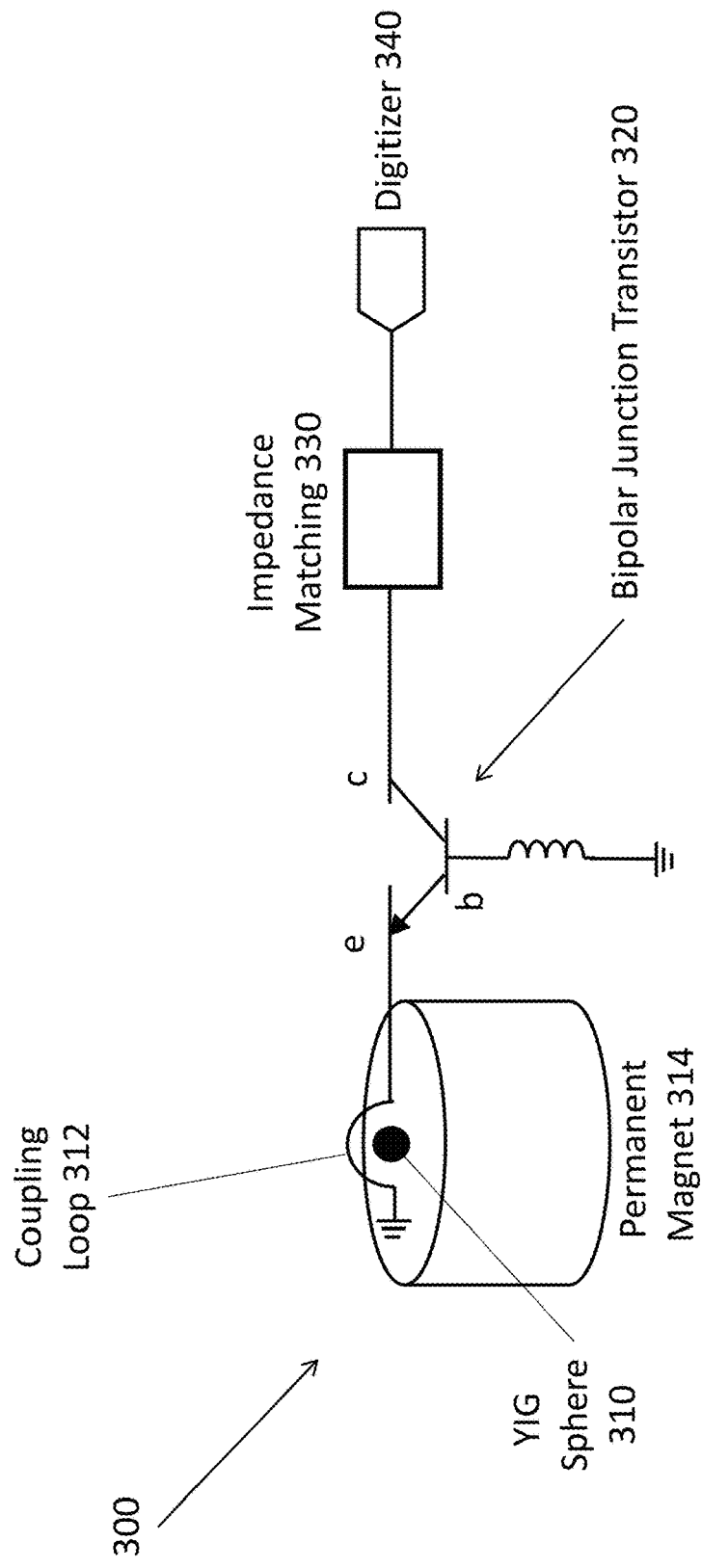

FIG. 6A shows a ferrimagnetic oscillator magnetometer with a reflection oscillator geometry.

Figure 6B:
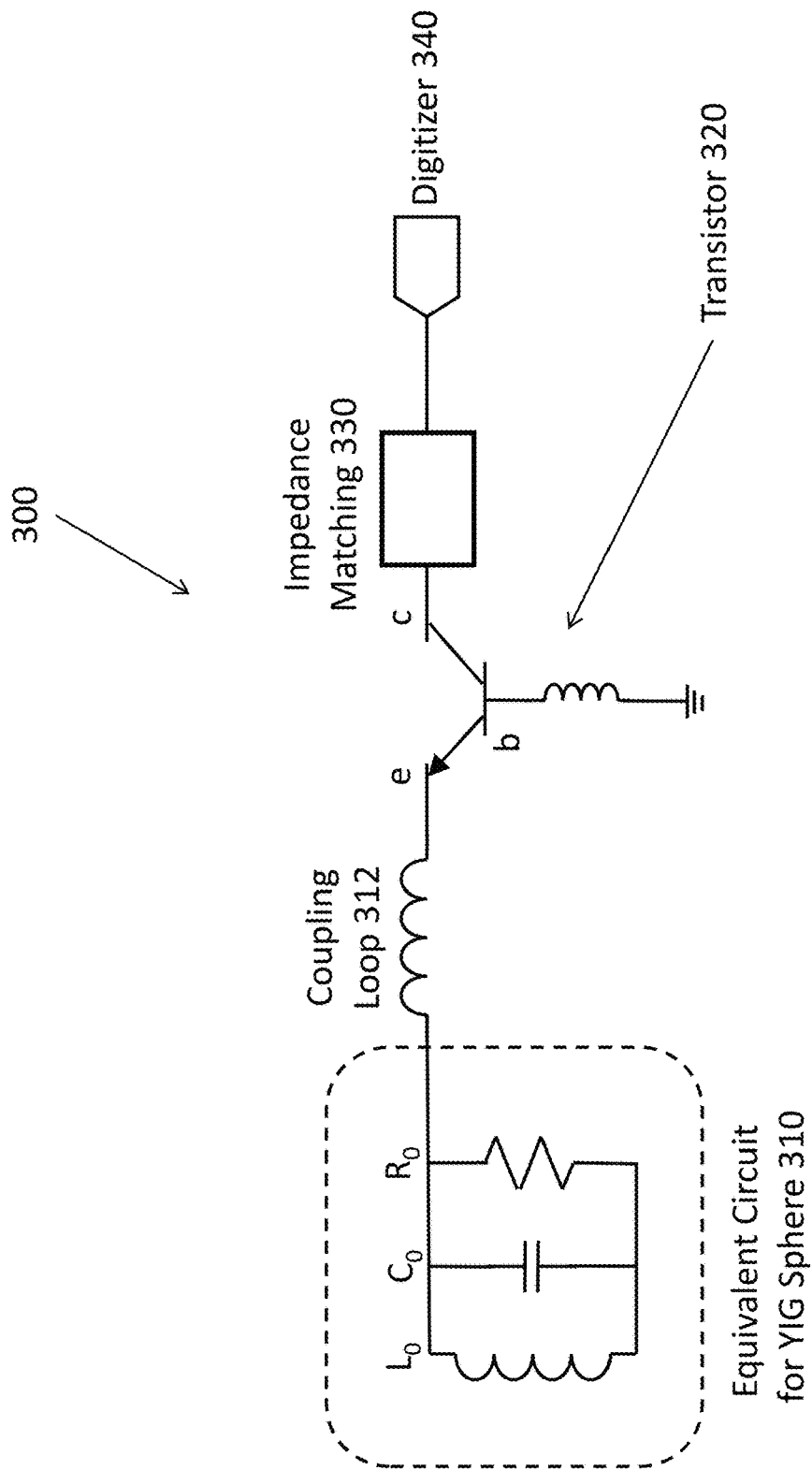

FIG. 6B shows an equivalent circuit for the ferrimagnetic oscillator magnetometer of FIG. 6A.

Figure 7A:
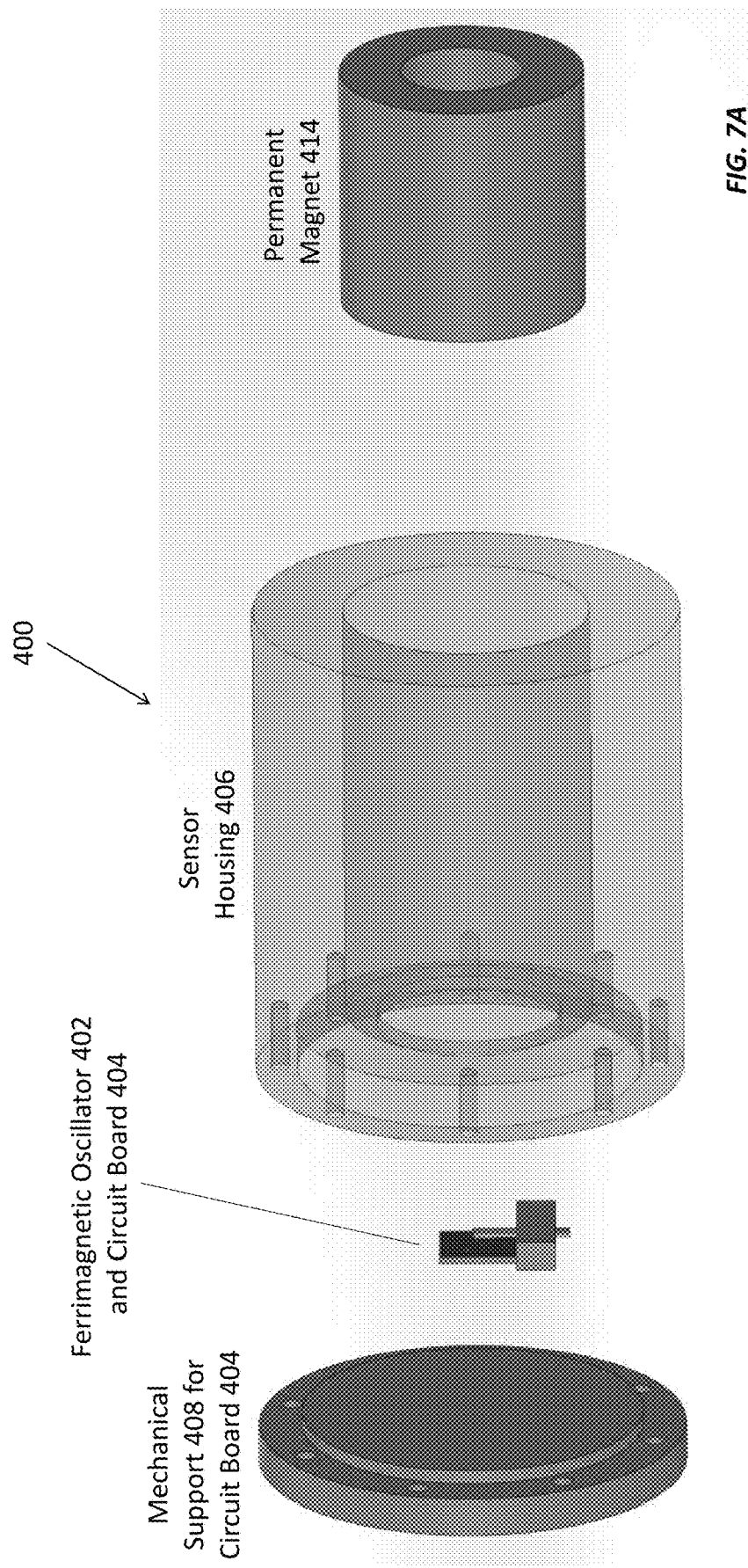

FIG. 7A is an exploded view of a ferrimagnetic oscillator magnetometer with a reflection oscillator geometry as in FIGS. 6A and 6B.

Figure 7C:
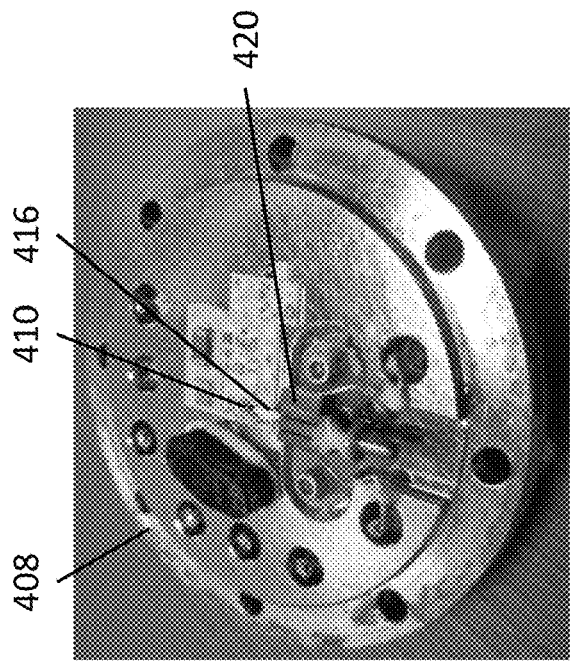
Figure 7B:
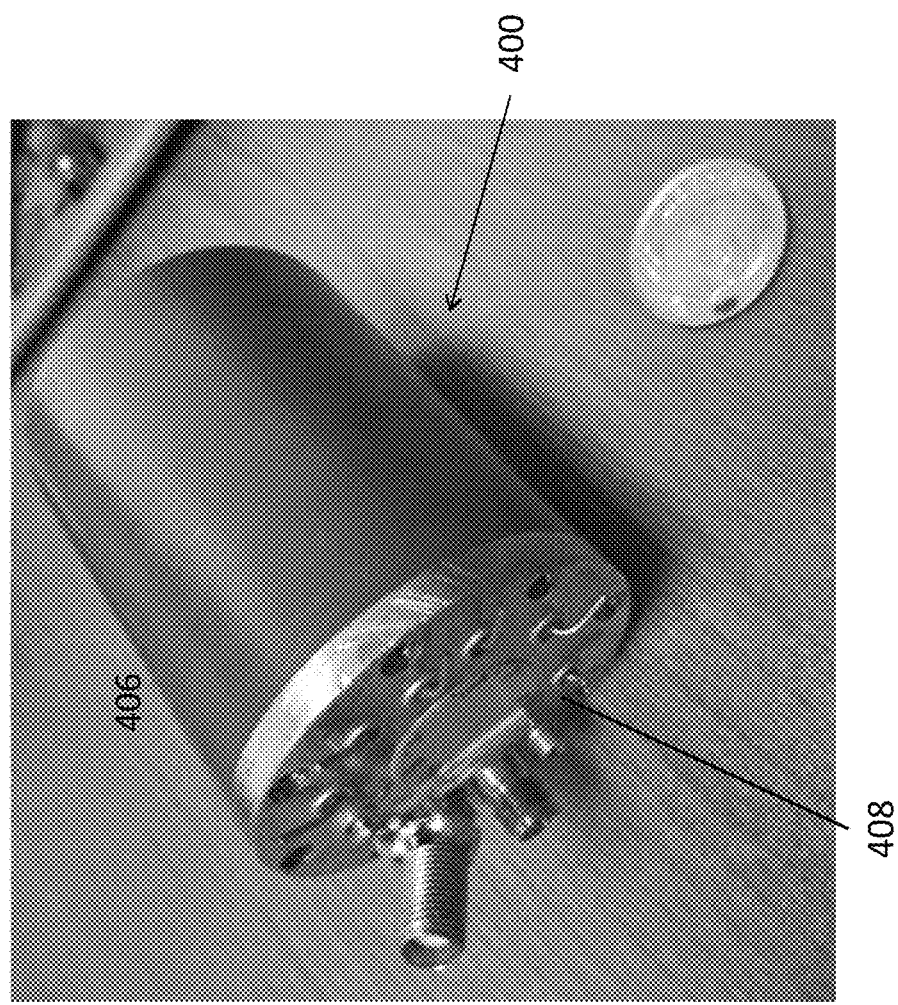

FIG. 7B is a photograph of the ferrimagnetic oscillator magnetometer of FIG. 7A.

FIG. 7C is a photograph of the inside of the ferro/ferrimagnetic oscillator magnetometer of FIG. 7A.

Figure 7D:
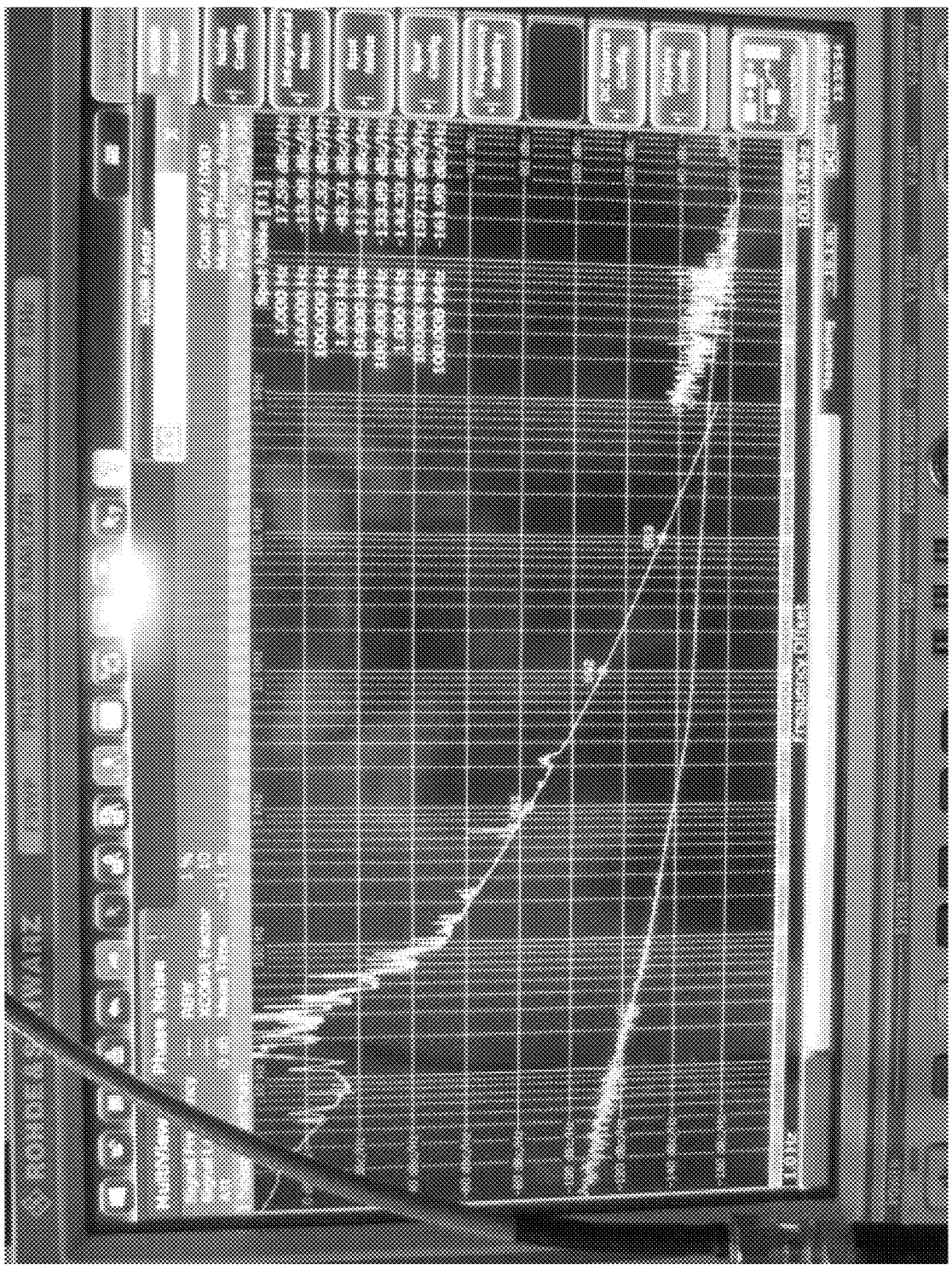

FIG. 7D is a plot of the phase noise performance of the ferrimagnetic oscillator magnetometer of FIGS. 7A-7C.

Figure 8:
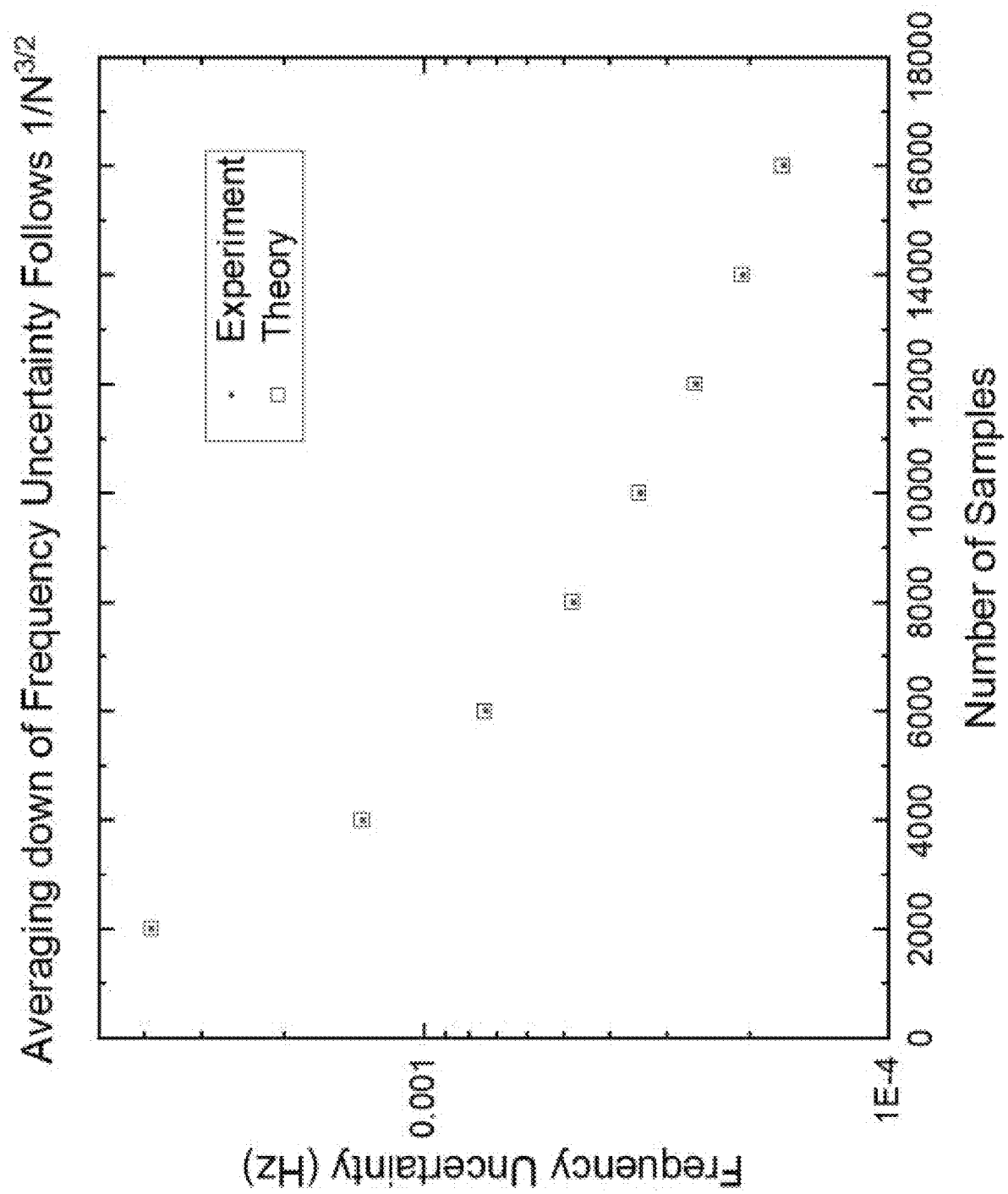

FIG. 8 is a plot of coherently averaged frequency uncertainty vs. number of samples for the ferrimagnetic oscillator magnetometer of FIGS. 7A-7C.

Figure 9:
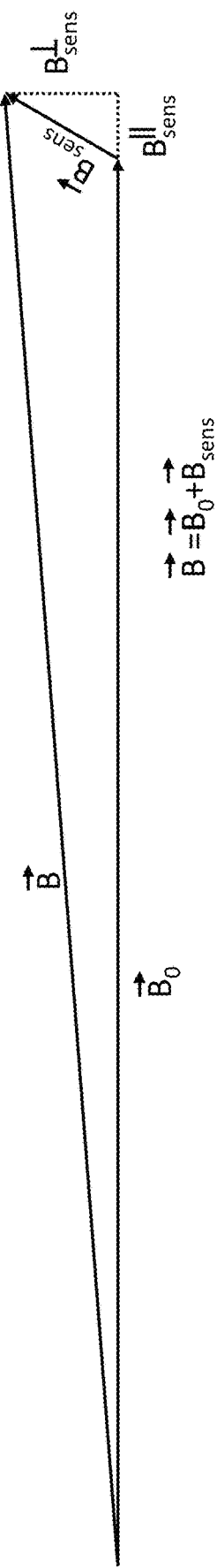

FIG. 9 illustrates how a ferrimagnetic oscillator magnetometer measures magnetic field direction and amplitude.

Figure 10:
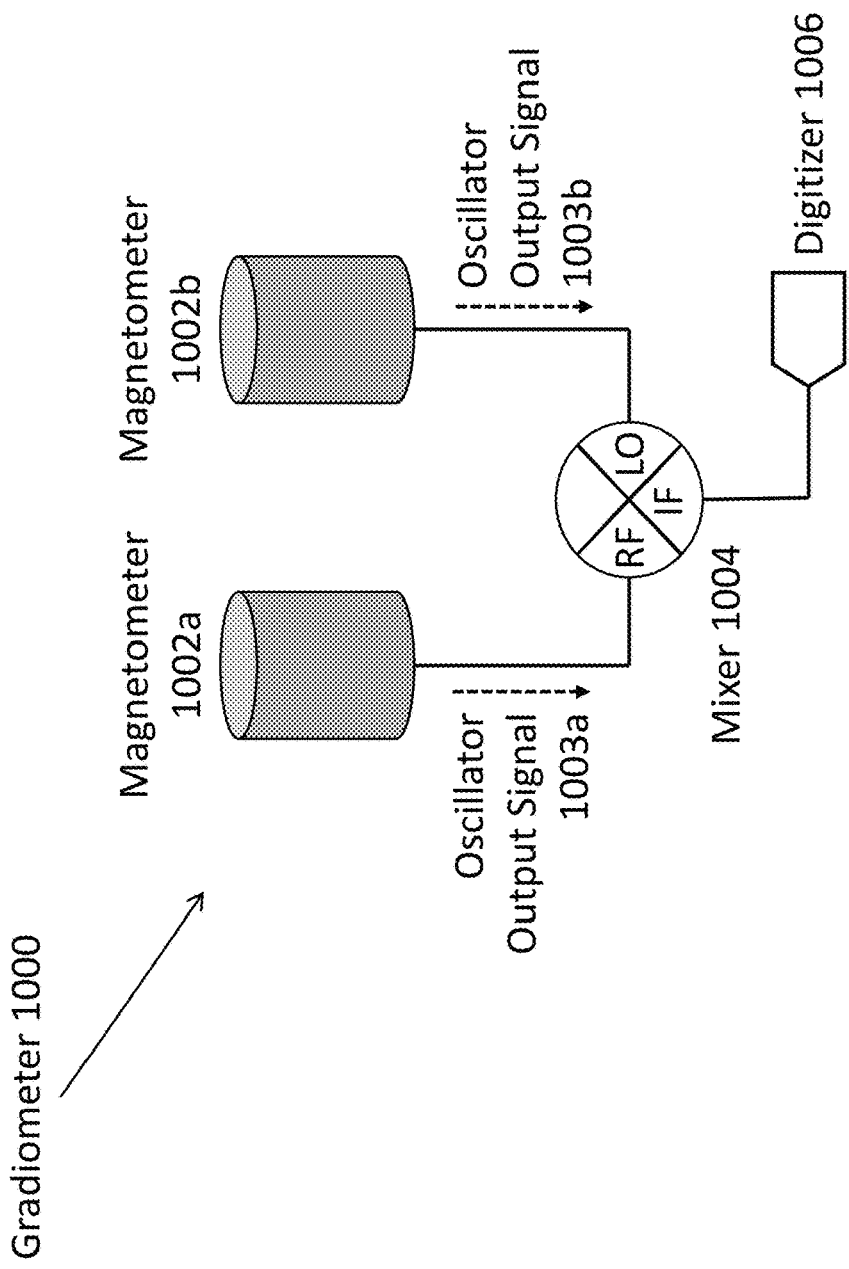

FIG. 10 shows a ferrimagnetic gradiometer.

DETAILED DESCRIPTION

Quantum sensors based on atomic gases or electron spins in solid-state crystals operate by localizing a resonance which varies with the parameter of interest. For example, the magnetic field may be deduced by measuring the frequency of uniform precession of a spherical ferrimagnetic sample, of the paramagnetic resonance of NVs in diamond, or of Zeeman transitions in an alkali vapor. Several experimental techniques have been developed for this task, from continuous-wave (CW) absorption or dispersion measurements to pulsed protocols such as Ramsey or pulsed electron spin resonance (ESR) schemes. In all these methods, external radio-frequency (RF) or optical fields manipulate the system, and the location of the resonance is inferred from the resulting response as a function of frequency of the applied field.

It is also possible, however, to employ a measurement architecture where the system sustains self-oscillation, generating a microwave (MW) output that encodes properties of the system's environment, rather than probing the system with an external MW field. A self-sustaining oscillator includes two main components: (1) a frequency-discriminating element and (2) a gain medium subject to some form of feedback (e.g., arranged in a loop with the frequency-discriminating element).

In the self-sustaining ferrimagnetic (and ferromagnetic) oscillator magnetometers disclosed here, a ferrimagnetic (or ferromagnetic) material serves as the frequency-discriminating element. The ferrimagnetic material acts as a quantum frequency discriminator, with a quantum mechanical resonance (here, also called a ferrimagnetic resonance) provided by an ensemble of entangled electronic spins. This ferrimagnetic resonance can be employed in a variety of ways to provide frequency discrimination of input fields; for example, the ferrimagnetic material can be strongly coupled to a cavity whose transmission and reflection depend on the detuning of the applied field relative to the ferrimagnetic resonance. Alternatively, the input and output couplers that couple the MW fields to the ferrimagnetic material can be orthogonal to each other, with negligible coupling to each other in the absence of the ferrimagnetic resonance. If the MW fields at the input and output couplers are each coupled to the quantum mechanical transition, the ferrimagnetic material provides a frequency-dependent coupling between the input and output couplers, where the transmission is maximized at the resonance frequency and negligible at large detunings from resonance.

The gain for the self-sustaining, ferrimagnetic oscillator magnetometer can be provided by an ordinary RF amplifier that returns a portion of its output to the input coupling loop, realizing sustained self-oscillation (under suitable conditions). No external microwave signal source is necessary; the RF amplifier emits radiation over a band encompassing the ferrimagnetic resonance frequency $\omega_y$ of the ferrimagnetic material, which transmits oscillations near the ferrimagnetic resonance frequency $\omega_y$ and block oscillations at other frequencies. The transmitted oscillations propagate back to the input of the RF amplifier, which amplifies them to produce a self-sustaining oscillation at an oscillation frequency $\omega_c$ that closely tracks the ferrimagnetic resonance frequency $\omega_y$. Thus, the oscillator architecture eliminates the need for a tunable external RF generator in the system.

In addition, encoding the signal in frequency rather than in amplitude confers several benefits, as frequency measurements can offer greater dynamic range and linearity compared to amplitude measurements. Dynamic range is particularly useful for a magnetometer; for example, detection of a 100 fT signal in Earth's field (about 0.1 mT) usually requires a dynamic range of about $10^9$.

Ferrimagnetic oscillator magnetometers are amenable to lithographic-type manufacturing processes. The ferrimagnetic crystal can be a thin layer (e.g., 30 microns or less) sputtered or otherwise deposited on a flat surface, such as part of a circuit board or integrated circuit. The ferrimagnetic crystal's high number of spins (e.g., about $5 \times 10^{19}$) almost all of which can be utilized, and narrow resonance linewidth (e.g., down to 370 kHz due to exchange narrowing from the entangled iron electrons) give a lower spin projection limit than any other sensor. The signal can be coherently averaged in the analog domain with the sensor or in the digital domain after digitization.

At steady state, a ferrimagnetic oscillator magnetometer satisfies the Barkhausen stability criterion, which is a mathematical condition to determine when a linear electronic circuit will oscillate. To satisfy the Barkhausen stability criterion, the oscillation frequency should correspond to an integer number of wavelengths around the oscillator loop, with unity total gain. This criterion, under reasonable assumptions, results in a phase-noise spectral density described by Leeson's equation, $$\mathcal{L}^{\frac{1}{2}}(f_m) = \sqrt{\frac{1}{2}\left[\frac{f_L^2}{f_m^2} + 1\right]\left[\frac{f_c}{f_m} + 1\right]\left[\frac{Fk_BT}{P_s}\right]}, \quad (1)$$

where $\mathcal{L}^{1/2}(f_m)$ is the single-sideband phase-noise spectral density at offset frequency $f_m$ from the carrier, $f_L$ is the Leeson frequency (equal to the loaded resonator half width half maximum), $f_c$ is the observed noise corner of the sustaining amplifier under operating conditions, $P_s$ is the input power to the sustaining amplifier, T is the temperature (assumed for simplicity to be the same for both the amplifier and the resonator), $k_B$ is Boltzmann's constant, and F is the sustaining amplifier wideband noise factor. Although phase noise is most commonly discussed as a power spectral density, $\mathcal{L}(f_m)$, the square root of the power spectral density, $\mathcal{L}^{1/2}(f_m)$, is often more relevant for the discussion here. Here, $\mathcal{L}(f_m)$ is called the phase-noise power spectral density and $\mathcal{L}^{1/2}(f_m)$ is called the phase-noise spectral density.

Leeson's equation results in an effective gain of noise at frequencies below the Leeson frequency $f_L$. Thus, the oscillator architecture is susceptible to additive phase noise sources inside the oscillation loop at frequencies below the Leeson frequency, so care should be taken in particular to reduce or minimize the noise contribution of the sustaining amplifier (the only active component inside the loop), which introduces its flicker noise and wideband noise figure into the system. In contrast, the noise requirements on components outside or after the oscillator magnetometer loop (e.g., buffer amplifiers, mixers, digitizers) may be relatively relaxed. The limited number of critical components is advantageous for compactness and simplicity of design.

Ferrimagnetic Resonance

In a ferrimagnetic material, strong coupling between nearby electronic spins results in collective spin behavior, including resonances between collective spin states. This strong spin-spin coupling can also result in exchange-narrowing of the ferrimagnetic resonances, thereby allowing sub-MHz transition linewidths to be observed in materials with unpaired spin densities of about $10^{22}$ cm$^{-3}$. From Leeson's equation (Eqn. (1)), a narrower resonance results in a lower value of $f_L$ and therefore is expected to result in better phase noise performance of the oscillator magnetometer. The magnetic material with the narrowest known ferromagnetic resonance linewidth and lowest known spin-wave damping is yttrium iron garnet (YIG), a synthetic, insulating crystal ferrimagnet with chemical composition $Y_3Fe_5O_{12}$. Other attractive aspects of YIG are low acoustic damping (less than that of quartz) and well-developed growth processes which yield samples of very high crystal quality. Consequently, YIG is the platform of choice in cavity spintronics research and has found use in magnon-cavity coupling experiments, magneto-acoustic coupling studies, and hybrid quantum circuits, as well as in axion searches.

In SI units, Kittel's formula for the uniform precessional mode of ferromagnetic resonance is $\omega_y = \sqrt{[\gamma B_z + (N_y - N_z)\gamma\mu_0 M_z][\gamma B_z + (N_x - N_z)\gamma\mu_0 M_z]}$, where $\gamma$ is the electron gyromagnetic ratio, $B = B_z\hat{z}$ is the applied magnetic field (which we take to define the $\hat{z}$ axis of the system), $M_z$ is the magnetization (assumed to be saturated), and $N_x$, $N_y$, and $N_z$ are the demagnetization factors. For a spherical sample, $N_x = N_y = N_z = 1/3$, and Kittel's formula reduces to $$\omega_y = \gamma B_z. \quad (2)$$

As presented here, Kittel's equations neglect crystal anisotropy, whereby additional Hamiltonian terms arise from electron interactions with the electric fields of the crystal lattice. These effects, when present, can be treated as perturbative corrections as explained below.

A ferrimagnetic resonance (FMR) can be employed as a frequency discriminator, passing signals with frequencies near $\omega_y$ while rejecting all others. Consider a geometry consisting of two orthogonal semicircular coupling loops with a small ferrimagnetic sphere centered at the intersection of the loop axes, as shown in FIG. 1A, and described below. In the presence of an externally applied DC magnetic bias field ($B = B_0\hat{z}$), magnetic domains within the sample align along $\hat{z}$, magnetizing the sphere. Microwave (MW) drive fields with angular frequency $\omega_d \approx \omega_y$, applied to the input coupling loop, induce precession of the sphere's magnetization about the $\hat{z}$ axis. The precessing magnetization then inductively couples to the output loop (with a $\pi/2$ phase shift relative to the input loop). For this construction, the transmission scattering parameter $S_{21}$ obeys $$S_{21} = \frac{\sqrt{\kappa_1\kappa_2}}{i(\omega_d - \omega_y) + \frac{\kappa_0 + \kappa_1 + \kappa_2}{2}} e^{-i\frac{\pi}{2}}. \quad (3)$$

where $\kappa_0$, $\kappa_1$, and $\kappa_2$ are the unloaded FMR linewidth, input coupling rate, and output coupling rate, respectively, in angular frequency units. The $|S_{21}|$ transmission exhibits a Lorentzian line shape with a maximum at the FMR frequency $\omega_y$ and a loaded full-width half-maximum (FWHM) linewidth $\kappa_L \equiv \kappa_0 + \kappa_1 + \kappa_2$.

Magnetometer performance depends upon localizing the ferrimagnetic resonance with precision, accuracy, and speed. The precision with which the FMR resonance can be localized (and therefore the ambient magnetic field determined) depends on the intrinsic linewidth of the FMR resonance $\kappa_0$. Single-crystal YIG exhibits the lowest linewidth of any known ferromagnetic or ferrimagnetic material, with highly polished YIG spheres exhibiting measured linewidths of $2\pi \times 560$ kHz or below. The material used for the measurements disclosed here exhibits a FWHM linewidth of about $2\pi \times 910$ kHz 0.03 mT) at $\omega_y \approx 2\pi \times 5$ GHz.

Minimal values of $\kappa_0$ arise under uniform orientation of the magnetic domains within the YIG crystal. This is achieved by applying an external bias magnetic field with sufficient strength to saturate the magnetization. For pure YIG, the saturation magnetization is reached using a bias field $B_0 \approx 0.178$ T. Operation in the saturated magnetization regime is important to ensure the ferrimagnetic resonance displays a constant response to changes in the externally applied magnetic field, namely $d\omega_y/dB = \gamma$.

Ferromagnetic and ferrimagnetic materials provide much higher unpaired electron spin density relative to paramagnetic or vapor cell atomic systems, which translates to small sensing volumes and thus tolerance to environmental magnetic field gradients.

In crystallographically perfect YIG, five of every twenty lattice sites (equivalent to one unit formula $Y_3Fe_5O_{12}$) are populated by trivalent iron ($Fe^{3+}$, electronic spin $S=5/2$), which occupy three tetrahedral lattice sites and two octahedral lattice sites. Strong superexchange interactions (mediated by oxygen ions between the iron ions) align the three tetrahedral $Fe^{3+}$ antiparallel to the two octahedral lattice $Fe^{3+}$ in the absence of thermal excitation. For a single magnetic domain at absolute zero temperature, YIG exhibits a net magnetic moment equal to that of one $Fe^{3+}$ atom per every 20 lattice atoms, resulting in a polarized electron spin density of $2.1 \times 10^{22}$/cm$^3$. Magnetization at room temperature retains 72% of the maximal magnetization, equal to a polarized electronic spin density of $1.5 \times 10^{22}$/cm$^3$. For comparison, typical paramagnetic spin systems exhibit spin densities within a few orders of magnitude of $10^{17}$/cm$^3$, while alkali vapor cells operate in the vicinity of $10^{13}$/cm$^3$.

The high spin density and strong coupling between spins, which prevents deleterious broadening, allows sensitivities of roughly 100 fT/$\sqrt{Hz}$ or better to be achieved using crystal volumes of $\lesssim 1$ mm$^3$. Magnetic gradients can compromise sensitivity when the gradient broadening becomes comparable to the intrinsic linewidth. Assuming an intrinsic linewidth of $\kappa_0 = 2\pi \times 1$ MHz results in a gradient tolerance of approximately 0.4 mT/cm before substantial degradation of sensor performance is expected. This gradient tolerance compares favorably to the roughly 30 nT/cm gradient tolerance characteristic of alkali vapor magnetometers (which exhibit sample volume length scales about ten times larger and intrinsic linewidths about one-thousand times smaller than the ferrimagnetic oscillator magnetometers disclosed here).

Changes in the external DC magnetic field at the magnetometer alter the FMR frequency $\omega_y$, and therefore the oscillator output frequency. The FMR frequency also responds to AC magnetic fields, and the process by which AC fields alter the magnetometer output waveform is disclosed below. Operationally, AC magnetic fields are encoded via frequency modulation into the oscillator's output waveform. For example, a single-frequency AC magnetic field with root-mean-square (rms) amplitude $B_{sen}^{rms}$ and angular frequency $\omega_m$ produces two sidebands at $\pm\omega_m$ relative to the oscillator carrier frequency. These two sidebands each exhibit a carrier-normalized amplitude of $$s = \frac{\gamma B_{sen}^{rms}}{\sqrt{2}\, \omega_m}. \tag{4}$$

The oscillator magnetometer's sensitivity can then be determined from the sideband amplitude along with the measured phase noise $\mathcal{L}^{1/2}(f_m)$, which represents the background against which the sidebands are discerned. The expected sensitivity is $$\eta(f_m) = \frac{f_m}{\gamma/(2\pi)} \mathcal{L}^{\frac{1}{2}}(f_m). \tag{5}$$

We note a surprising and striking feature of the oscillator magnetometer architecture: assuming the oscillator phase noise is well-described by Leeson's equation (Eqn. (1)), the signal $s \propto 1/\omega_m = 1/(2\pi f_m)$ and the phase noise are expected to exhibit nearly identical scaling within a range of frequencies between the amplifier noise corner $f_c$ and the Leeson frequency $f_L$. Thus, the sensitivity of the device versus frequency $f_m$ is expected to be approximately flat for $f_c < f_m < f_L$.

Transmission-Geometry Ferrimagnetic Oscillator Magnetometer

FIG. 1A shows a ferrimagnetic oscillator magnetometer 100 that can be used to measure alternating current (AC) or time-varying magnetic fields. This magnetometer 100 uses a transmission geometry with four components connected in serial loop: a ferrimagnetic resonance transmission filter 110 (which passes signals near the ferrimagnetic resonance $\omega_y$ and rejects signals at other frequencies), a sustaining amplifier 120 (to provide the requisite gain), a directional coupler 130 (to sample the oscillator waveform for device output), and an optional phase shifter 122 (to ensure that the Barkhausen stability criterion is satisfied).

As explained in greater detail, the ferrimagnetic resonance transmission filter 110 has resonance whose center frequency shifts in response to the magnitude and direction of an external magnetic field. This ferrimagnetic resonance transmission filter 110 acts as a magnetic field sensing element and can be implemented as a 1-mm-diameter, highly polished YIG ($Y_3Fe_5O_{12}$) sphere, which acts as a transmission cavity. Other suitable ferrimagnetic materials for the filter 110 include but are not limited to Gallium-doped YIG ($Ga^{3+}:Y_3Fe_5O_{12}$), Aluminum-doped YIG ($Al^{3+}:Y_3Fe_5O_{12}$), Lithium Ferrite ($Li_{0.5}Fe_{2.5}O_4$), or Calcium Vanadium Bismuth Iron Garnet ($Ca_2VBiFe_4O_{12}$). In this example, the YIG sphere is mechanically supported between the dimpled end faces of two 3-mm-diameter, 10-mm-long rods (not shown) made of sapphire, beryllia (BeO), or another electrically insulating material with high thermal conductivity.

As shown in FIG. 1A, a semicircular input coupling loop 112a and semicircular output coupling loop 112b (e.g., each of 3.5±0.5 mm radius) provide inductive coupling to and from the YIG sphere 110. The coupling loops 112 are mounted orthogonal to each other so that $S_{21}$ transmission can only occur through the gyrator action of the ferrimagnetic resonance, with transmission far from resonance suppressed to negligible levels. In practice, the coupling loops 112 do not have to be exactly orthogonal; minor twisting and positional variation of the coupling loops 112 should not produce any problematic off-resonant coupling.

The input coupling rate $\kappa_1$ and output coupling rate $\kappa_2$ between the filter 110 and the coupling loops 112 can be adjusted by changing the diameters of the coupling loops, while the intrinsic linewidth $\kappa_0$ of the filter 110 is essentially a fixed property of the device (depending on the quality of the YIG, the uniformity of the bias magnetic field, etc.). The values of $\kappa_0$, $\kappa_1$ and $\kappa_2$ are determined by simultaneously measuring the S-parameters $S_{11}$ and $S_{21}$ on the ferrimagnetic resonance transmission filter 110. In this example, the total loaded angular linewidth is $\kappa_L \equiv \kappa_0 + \kappa_1 + \kappa_2 = 2\pi \times 1.60$ MHz, equivalent to a loaded quality factor $Q_L = 3125$, so that the Leeson frequency is $$f_L \equiv \frac{1}{2}\frac{\kappa_L}{2\pi} = 800 \text{ kHz}.$$

For this magnetometer, $\kappa_0 = 2\pi \times 910$ kHz, $\kappa_1 = 2\pi \times 370$ kHz, and $\kappa_2 = 2\pi \times 320$ kHz.

Two cylindrical permanent magnets 114 positioned symmetrically along the axis $\hat{z}$ relative to the ferrimagnetic sphere 110 apply a uniform bias magnetic field $B_0 = B_0\hat{z}$ as shown in FIG. 1A. The amplitude of the uniform bias magnetic field should be high enough (e.g., $B_0 \approx 0.178$ T) to ensure that the sphere's magnetization is saturated, so that the filter response is governed by $\omega_y(t) = \gamma B(t)$. Ceramic (strontium ferrite) bias magnets 114 may be employed to reduce or minimize shielding of alternating current (AC) magnetic fields to be sensed. The YIG sphere is aligned so that its <111> easy axis lies along $\hat{z}$, i.e., parallel to $B_0$. With this bias magnetic field, the oscillation frequency is about $2\pi \times 5$ GHz.

The YIG sphere's precessing magnetization continuously induces a voltage on the output coupling loop 112b, with a frequency equal to the magnetization precession frequency. This 1\4 W voltage signal then passes through the 10 dB directional coupler 130. The through port of the directional coupler 130 connects to the sustaining amplifier 120 followed by the optional (mechanically adjustable) phase shifter 122 as shown in FIG. 1A. For oscillator frequencies at X-band and above, a SiGe transistor or InGaP transistor can be used as the sustaining amplifier 120. After the phase shifter 122, the MW signal is directed to the input coupling loop 112a as indicated by the dashed arrows in FIG. 1A, which inductively couples the MWs back to the YIG's precessing magnetization, closing the oscillator loop. The phase shifter is adjusted to reduce or minimize the device phase noise, which is measured in real time.

The ferrimagnetic crystal 110 hosts an ensemble of entangled electronic spins, which together have a transmission resonance whose center frequency shifts in response to an applied magnetic field (e.g., an alternating current (AC) magnetic field). The analog microwave signal propagating through the loop formed by the ferrimagnetic crystal 110 and sustaining amplifier 120 probes this resonance. Changes in the magnitude or direction of the applied magnetic field shift the resonance of the ensemble of entangled electronic spins. The shift in the resonance in turn modulates the analog microwave signal, producing upper and lower sidebands whose amplitudes are proportional to the magnitude of the applied magnetic field. The coupler 130 has a tap port that diverts a portion (e.g., 1%, 5%, or 10%) of this sideband-modulated analog microwave signal to the digitizer 140, which generates a digital version of the signal that can be used sense the sidebands and hence the (change in) direction and/or magnitude, frequency, or phase of the applied magnetic field.

The ferrimagnetic oscillator magnetometer 100 is like other oscillators in that it includes a frequency-selective element (the ferrimagnetic crystal 110) and a gain mechanism (the sustaining amplifier 120). The ferrimagnetic resonance has a center frequency and a quality factor Q. It is causal (like everything in the real world), so it has a path length (and a delay). As a result, the ferrimagnetic resonance acts just like a RF/MW filter cavity. Microwaves input into the input coupling loop 112a couple to the output coupling loop 112b by coupling through the spins precessing at the ferrimagnetic resonance. Signals at frequencies near the ferrimagnetic resonance are passed and frequencies away from the ferrimagnetic resonance are strongly attenuated. Thus, the ferrimagnetic element 110 acts as a frequency filter by passing frequencies within a linewidth of the ferrimagnetic resonance and rejecting other frequencies. An optional bandpass filter (not shown) may be used to suppress spurious frequencies. The sustaining amplifier 120 has gain near the ferrimagnetic resonance frequency and makes up for the round-trip loss of the oscillator.

Frequency selectivity is enforced both by the amplitude of transition through the ferrimagnetic resonance and by setting the round-trip phase to be an integer multiple of 2π. For the ferrimagnetic oscillator magnetometer 100, most of the path length comes from the high-Q RF/microwave cavity formed by the YIG sphere 110. (At a frequency of 5 GHz, the wavelength in air is 6 cm, so for a loaded quality factor Q=5000, the effective path length will be approximately 300 meters.) If the optional bandpass filter passes frequencies within 100 MHz or so of the ferrimagnetic resonance, the oscillator should automatically oscillate at the ferrimagnetic resonance without any external microwaves or laser.

In one example, under typical operating conditions, the input power to the sustaining amplifier 120 is $P_s=-3$ dBm. The sustaining amplifier 120 has a measured gain of 11.4 dB at $P_s=-3$ dBm, so that, after accounting for roughly 1 dB of additional loss, about 7.4 dBm of MW power is delivered to the input coupling loop 112a. The sustaining amplifier 120 is powered by a 12-volt lead-acid battery (not shown) to partially mitigate the additive phase noise induced by amplifier power supply voltage fluctuations.

The 10 dB directional coupler 130 allows sampling of the oscillator's voltage waveform; measurement of this waveform allows reconstruction of the magnetic field waveform as described below. The output of coupled port of the directional coupler 130 is coupled to a 1×2 switch 132, which has one port coupled directly to a phase-noise analyzer 150 (for device diagnostics) and one port coupled to a mixer 136 via a buffer amplifier 134. The phase-noise analyzer 150 can be used to perform diagnostics and device optimization. The mixer 136 is coupled to a local oscillator 138 mixes the signal down to an intermediate frequency, $\omega_i$, in a range (e.g., MHz) appropriate for a digitizer 140.

Figure 1B:
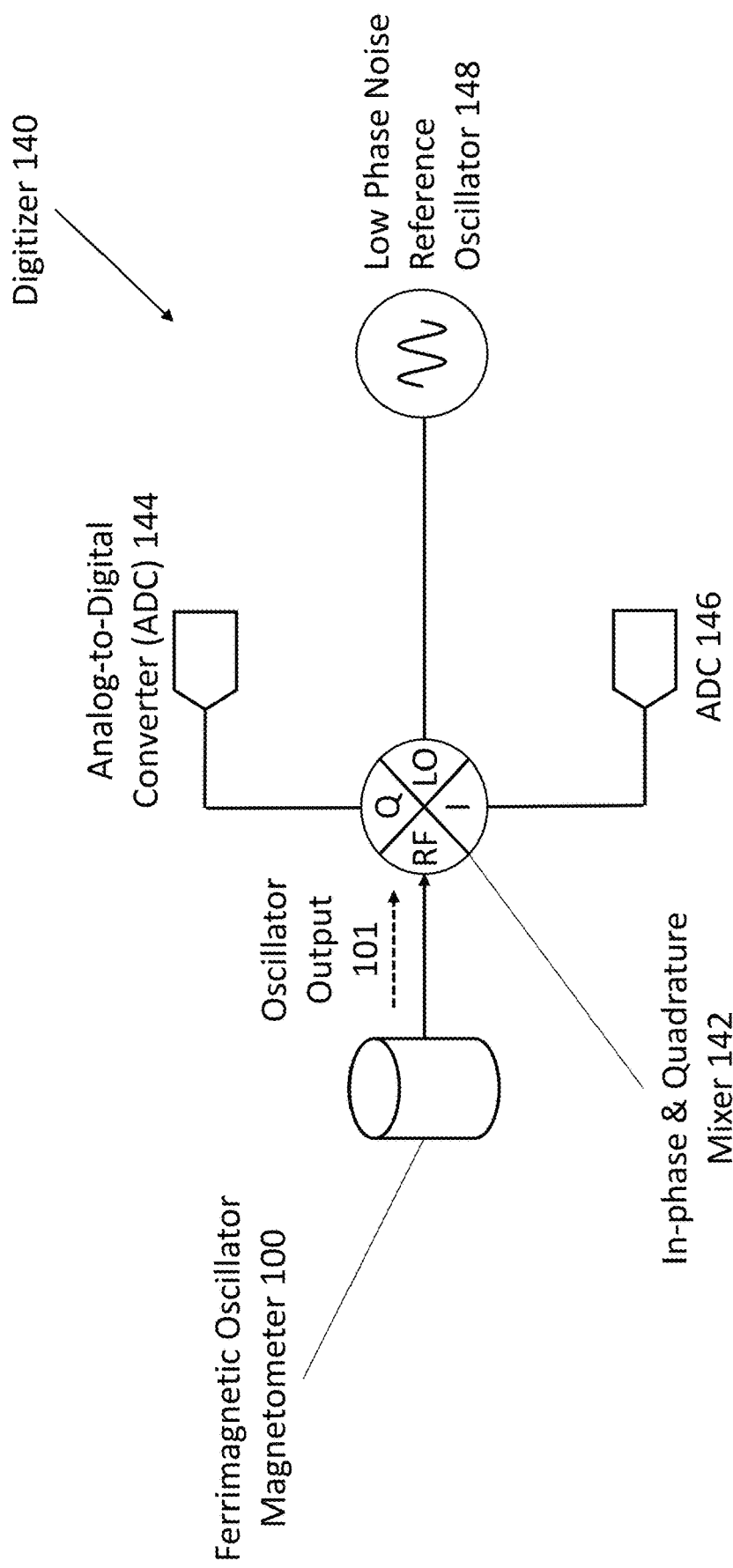
FIG. 1B shows an architecture for the digitizer at the output of the ferrimagnetic oscillator magnetometer of FIG. 1A.

FIG. 1B shows an implementation of the digitizer 140 that converts the analog, frequency-modulated signal from the ferrimagnetic oscillator magnetometer 100 into in-phase and quadrature intermediate-frequency signals, which are then converted into digital signals. A mixer 142 mixes an analog output 101 from a ferrimagnetic oscillator magnetometer with a local oscillator (LO) from a low-phase-noise reference oscillator 148 to produce in-phase and quadrature components that can be digitized by respective analog-to-digital converters (ADCs) 144 and 146. These components can be demodulated as described below.

Equivalent Circuit for YIG, S-Parameters, and Intrinsic Linewidth

Figure 1C:
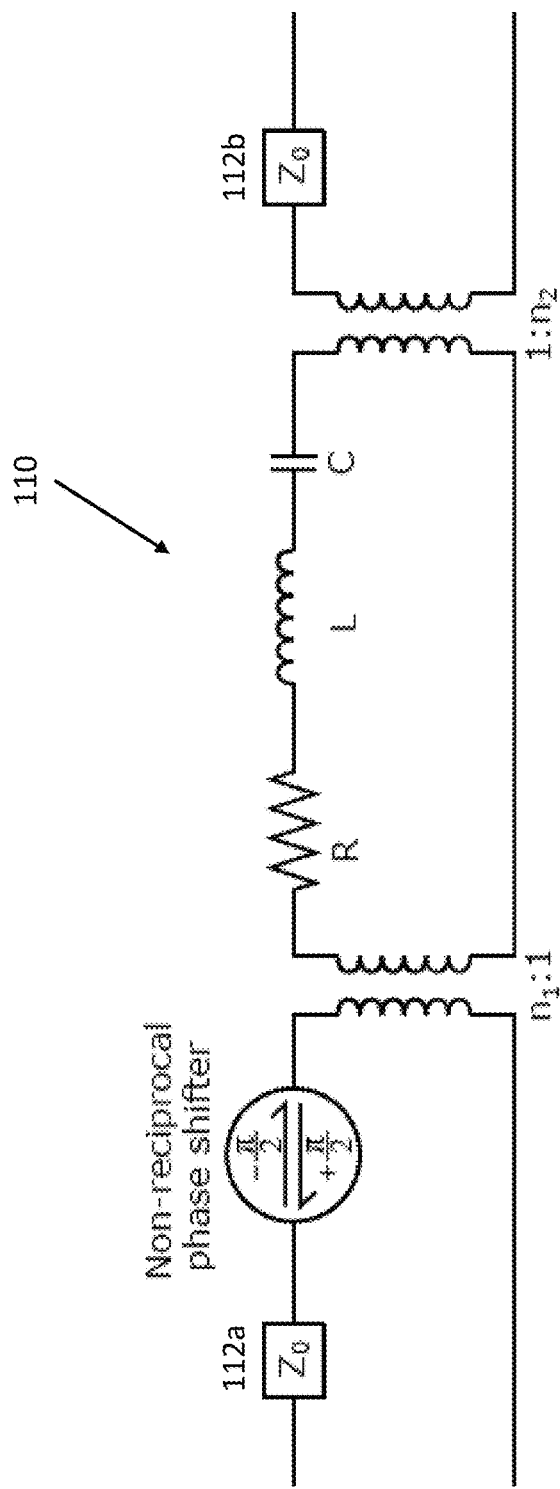
FIG. 1C shows an equivalent circuit for the YIG sphere and coupling loops in the ferrimagnetic oscillator magnetometer of FIG. 1A. The equivalent circuit for the YIG sphere can be modelled as a series RLC circuit with idealized inductive coupling and a non-reciprocal $7r/2$ phase shifter to account for the gyrator action of the YIG.

FIG. 1C shows an equivalent circuit for the YIG sphere 110 with orthogonal coupling loops 112 (e.g., two loops in planes rotated from each other by π/2, the geometry of this device, shown as impedances $Z_0$). This circuit closely resembles the equivalent circuit for a series RLC circuit with inductive coupling. One difference is that the gyrator action of the YIG sphere 110 introduces a direction-dependent (i.e., non-reciprocal) phase shift: $S_{21}$ is retarded by π/2 while $S_{12}$ is advanced by π/2. The S parameters describing this system are $$S_{11} = 1 - \frac{\kappa_1}{i(\omega_d - \omega_y) + (\kappa_0 + \kappa_1 + \kappa_2)/2} \quad (6)$$

$$S_{21} = \frac{\sqrt{\kappa_1 \kappa_2}}{i(\omega_d - \omega_y) + (\kappa_0 + \kappa_1 + \kappa_2)/2} e^{-i\pi/2} \quad (7)$$

$$S_{12} = \frac{\sqrt{\kappa_1 \kappa_2}}{i(\omega_d - \omega_y) + (\kappa_0 + \kappa_1 + \kappa_2)/2} e^{i\pi/2} \quad (8)$$

$$S_{22} = 1 - \frac{\kappa_2}{i(\omega_d - \omega_y) + (\kappa_0 + \kappa_1 + \kappa_2)/2} \quad (9)$$

where $\omega_d$ is the drive frequency, $\omega_y$ is the ferrimagnetic resonance frequency, $\kappa_0 = R/L$ is the intrinsic YIG linewidth, $\kappa_1 = Z_0/n_1^2 L$ is the input coupling rate, and $\kappa_2 = Z_0/n_2^2 L$ is the output coupling rate. The parameters $\omega_d$, $\omega_y$, $\kappa_0$, $\kappa_1$, and $\kappa_2$ are all in angular units. The intrinsic linewidth of the ferrimagnetic resonance filter 110 is given by $\kappa_0 = \omega_y/Q_0$, where $Q_0$ is the unloaded quality factor of the YIG sphere, extracted from measurements performed by sweeping $\omega_d$ while $B_0$ is fixed. The intrinsic linewidth can also be determined by sweeping the value of $B_0$ for a fixed value of $\omega_d$, and literature values of YIG linewidths are often given in magnetic field units rather than frequency units. The S-parameter equations above are valid only near resonance, both because of the inclusion of the ideal transformer and because the equations have been symmetrized about the resonance frequency.

We wish to determine the intrinsic linewidth $\kappa_0$ of the uniform mode ferrimagnetic resonance from S-parameter data measured by a vector network analyzer (VNA) on a two-port YIG transmission filter, as shown in FIG. 1A. From the Eqns. (6) and (7), the maximum and minimum of the power transmission and reflection are, respectively, $$|S_{11}|_{min}^2 = \left(1 - \frac{\kappa_1}{\left(\frac{\kappa_0 + \kappa_1 + \kappa_2}{2}\right)}\right)^2,$$

-continued $$|S_{11}|^2_{max} = \frac{\kappa_1 \kappa_2}{\left(\frac{\kappa_0 + \kappa_1 + \kappa_2}{2}\right)^2}.$$

The value of the loaded linewidth, $\kappa_L = \kappa_0 + \kappa_1 + \kappa_2$, can be determined from the distance between the points where $|S_{21}|^2$ is reduced by 3 dB from its peak value. The system can then be solved for $\kappa_0$, $\kappa_1$, and $\kappa_2$, as there are three equations and three unknowns:

$$\kappa_0 = \frac{\kappa_L}{2}\left(1 + \sqrt{|S_{11}|^2_{min}} - \frac{|S_{11}|^2_{max}}{1 - \sqrt{|S_{11}|^2_{max}}}\right),$$

$$\kappa_1 = \frac{\kappa_L}{2}\left(1 - \sqrt{|S_{11}|^2_{min}}\right),$$

$$\kappa_2 = \frac{\kappa_L}{2}\left(\frac{|S_{11}|^2_{max}}{1 - \sqrt{|S_{11}|^2_{min}}}\right).$$

Ferrimagnetic Oscillator Magnetometer Operation

FIGS. 2A-2C illustrates the principles of operation of the ferrimagnetic oscillator magnetometer 100 shown in FIG. 1A. FIG. 2A shows the ferrimagnetic YIG sphere 110 subjected to a uniform external magnetic field B from the bias magnet 114 (FIG. 1A). This uniform magnetic field causes the electronic spins of the ferrimagnetic YIG sphere 110 to precess in phase at the resonance frequency $\omega_y$. (FIG. 2A shows four spins, each depicted as an arrow following a corresponding dashed circular track.) The resonance (and precession) frequency $\omega_y$ of the uniform ferrimagnetic resonance mode varies linearly with the total magnetic field seen by the sphere as shown in FIG. 2B. When the ferrimagnetic resonance is employed as a frequency discriminator in a ferrimagnetic oscillator magnetometer, the oscillation frequency of the ferrimagnetic oscillator magnetometer tracks the ferrimagnetic resonance frequency. As a result, changes in the amplitude of the magnetic field cause the oscillation frequency to change.

FIG. 2C shows how the amplitude of the magnetic field B(t) applied to the magnetometer is encoded in frequency modulation of the oscillator's output waveform. Decreasing the magnetic field amplitude reduces the oscillation frequency. And increasing the magnetic field amplitude increases the oscillation frequency. By demodulating the output waveform, the original time-domain magnetic field signal B(t) may be recovered.

For the uniform mode of ferrimagnetic resonance in a spherical sample (e.g., the YIG sphere 110 in the magnetometer 100 of FIG. 1A) with saturated magnetization, the time derivative of the instantaneous phase $\phi(t)$ obeys $$\frac{d\phi(t)}{dt} = \gamma B(t), \quad (10)$$

where B(t) is the externally applied magnetic field and $\gamma = g_e \mu_B / \hbar$ (with the electron g-factor $g_e \approx 2$, the Bohr magneton $\mu_B$, and the reduced Planck's constant $\hbar$, so that $\gamma \approx 2\pi \times 28$ GHz/Tesla). (For this discussion, we neglect crystal anisotropy, which introduces higher order terms into Eqn. (10).)

The precessing magnetization of the sphere described by Eqn. (10) inductively couples to the output coil (e.g., coil 112b in FIG. 1A), producing a voltage signal which is then amplified by the sustaining amplifier (e.g., amplifier 120 in FIG. 1A) and inductively coupled back to the precessing magnetization; this closed loop produces sustained self-oscillation. The oscillator output voltage is then $v(t) = V_0 \cos[\phi(t)]$ where $V_0$ corresponds to the oscillator's voltage amplitude. Since the oscillating voltage at any point in the loop has a fixed phase relative to the magnetization, we do not distinguish between the phase of the magnetization and the phase of the oscillator's voltage output.

The oscillator phase $\phi(t)$ is continuous in time and given by $$\phi(t) = \int_0^t \frac{d\phi(\tau)}{d\tau}d\tau = \int_0^t \gamma B(\tau)d\tau,$$

where $\phi(t=0)=0$. The total magnetic field B(t) seen by the magnetometer is the vector sum of a static field $B_0 = B_0 \hat{z}$ (created by the permanent magnets 114) and the ambient field $B_{sen}(t)$ external to the magnetometer. For simplicity, assume that $B_{sen}(t)$ lies along $\hat{z}$ (the case of arbitrary $B_{sen}(t)$ is described below). The value of $B_0$ is assumed to exhibit only slow temporal variation (due to thermal drift of the magnets or vibration of the mechanical structure holding the magnets) on time scales below the frequencies of interest, so that $B_0$ can be treated as constant. The total magnetic field seen by the ferrimagnetic sphere is $B(t) = B_0 + B_{sen}(t)$, allowing the oscillator phase to be expressed as $$\phi(t) = \int_0^t \gamma[B_0 + B_{sen}(\tau)]d\tau. \quad (11)$$

An arbitrary real waveform $B_{sen}(t)$ can be decomposed into its Fourier series as $$B_{sen}(t) = \frac{a_0}{2} + \sum_{n=1}^{\infty} a_n \cos(\omega_n t) + \sum_{n=1}^{\infty} b_n \sin(\omega_n t).$$

For simplicity, assume that $B_{sen}(t)$ consists of a single spectral component such that $B_{sen}(t) = \sqrt{2} B_{sen}^{rms}[\cos \omega_m t]$, where $\omega_m$ is the angular frequency of the magnetic field and $B_{sen}^{rms}$ is the rms field amplitude. With this simplification, the oscillator phase is $$\phi(t) = \int_0^t \gamma\left[B_0 + \sqrt{2} B_{sen}^{rms}[\cos\omega_m \tau]\right]d\tau$$

$$= \gamma B_0 t + \sqrt{2}\frac{\gamma B_{sen}^{rms}}{\omega_m}[\sin\omega_m t].$$

The oscillator waveform (e.g., as in the upper trace of FIG. 2C) is then $$v(t) = V_0 \cos\left[\gamma B_0 t + \sqrt{2}\frac{\gamma B_{sen}^{rms}}{\omega_m}\sin[\omega_m t]\right].$$

This expression for the oscillator waveform can be transformed using a Bessel function identity and subsequently Taylor expanded (with $\gamma B_{sen}^{rms} \ll \omega_m$) to give $$v(t) = V_0 \left[ \cos[\gamma B_0 t] + \frac{\gamma B_{sen}^{rms}}{\sqrt{2}\,\omega_m} \cos[(\omega_c + \omega_m)t] - \frac{\gamma B_{sen}^{rms}}{\sqrt{2}\,\omega_m} \cos[(\omega_c - \omega_m)t] + H.O. \right],$$

where "H.O." represents higher-order terms in the Taylor expansion. For external fields satisfying $\gamma B_{sen}^{rms} \ll \omega_m$, the B-field frequency modulation results in two antisymmetric sidebands at $\pm\omega_m$, each with amplitude $\gamma B_{sen}^{rms}/(\sqrt{2}\omega_m)$. For example, a 1 pT RMS magnetic field at 100 kHz produces two sidebands each with power −134 dBc.

The oscillator's instantaneous phase $\phi(t)$ is governed by Eqn. (7), where the bias field from the bias magnet(s) is large enough to saturate the magnetization of the ferrimagnetic material. Differentiating the oscillator's instantaneous phase yields $$\frac{d\phi(t)}{dt} = \gamma[B_0 + B_{sen}(t)].$$

The time domain magnetic field waveform $B_{sen}(t)$ is then determined by calculating $$B_{sen}(t) = \frac{\frac{d\phi(t)}{dt}}{\gamma} - B_0.$$

As a practical matter, the demodulation process can be facilitated by applying the Hilbert transform to the (real-valued) voltage waveform of the oscillator, producing a complex signal that allows the instantaneous phase $\phi(t)$ to be determined in a simple manner. The phase is then unwrapped if appropriate so that it is continuous and free from $2\pi$ jumps, and finally $d\phi(t)/dt$ is calculated numerically.

The instantaneous phase of the oscillator encodes the value of the magnetic field. The Hilbert transform allows the instantaneous phase $\phi(t)$ to be determined in isolation from variations in the instantaneous amplitude. There are two conditions on the Hilbert transform to achieve this objective: First, the additive phase noise $\varphi(t)$ should be small, i.e., $|\varphi(t)| \ll 1$; and second, the additive phase noise $\varphi(t)$ and additive amplitude noise $\alpha(t)$ should vary slowly compared to the intermediate frequency out of the mixer $\omega_i$ (that is, they should have negligible frequency components above $\omega_i$). The first and second conditions hold for the ferrimagnetic oscillator magnetometers disclosed here.

The output of the mixer is digitized and may be written as a real-valued waveform, $$v(t) = V_0[1+\alpha(t)]\cos[\omega_i t + \varphi(t)]. \quad (12)$$

As $|\varphi(t)| \ll 1$ (the first condition), trigonometric identities and the approximations $\cos\varphi(t) \approx 1$ and $\sin\varphi(t) \approx \varphi(t)$ allow Eqn. (12) to be rewritten as $$v(t) \approx V_0[1+\alpha(t)][\cos[\omega_i t] - \varphi(t)\sin[\omega_i t]].$$

From Bedrosian's theorem, the second condition (that $\alpha(t)$ and $\varphi(t)$ vary slowly compared to $\omega_i$) allows the Hilbert transform of v(t) to be calculated by transforming only the high frequency components $\cos[\omega_i t]$ and $\sin[\omega_i t]$. Denoting the Hilbert transform of v(t) as $\hat{v}(t)$ yields $$\hat{v}(t) \approx V_0[1+\alpha(t)][\sin[\omega_i t] + \varphi(t)\cos[\omega_i t]].$$

Using small angle approximations (the first condition) and trigonometric identities gives the resulting analytic signal:

$$v(t) + i\hat{v}(t) \approx V_0[1+\alpha(t)]e^{i(\omega_i t + \varphi(t))}.$$

The instantaneous phase of the mixed-down signal $\omega_i t + \varphi(t)$ can be determined by taking the argument of the above analytic signal. As the quantity $[1+\alpha(t)]$ is common to both the real and imaginary components, the additive amplitude noise $\alpha(t)$ is thereby isolated from the instantaneous phase. This approach should be compared to the real-valued waveform of Eqn. (12) where there is no direct way to isolate the instantaneous phase from additive amplitude noise.

Note that $\varphi(t)$ is real, so its double-sided power spectrum is symmetric about zero frequency. Therefore, in the frequency domain picture, it may not be possible to gain any sensitivity by processing both the positive and negative frequency sidebands, as their information is redundant.

Figure 3A:
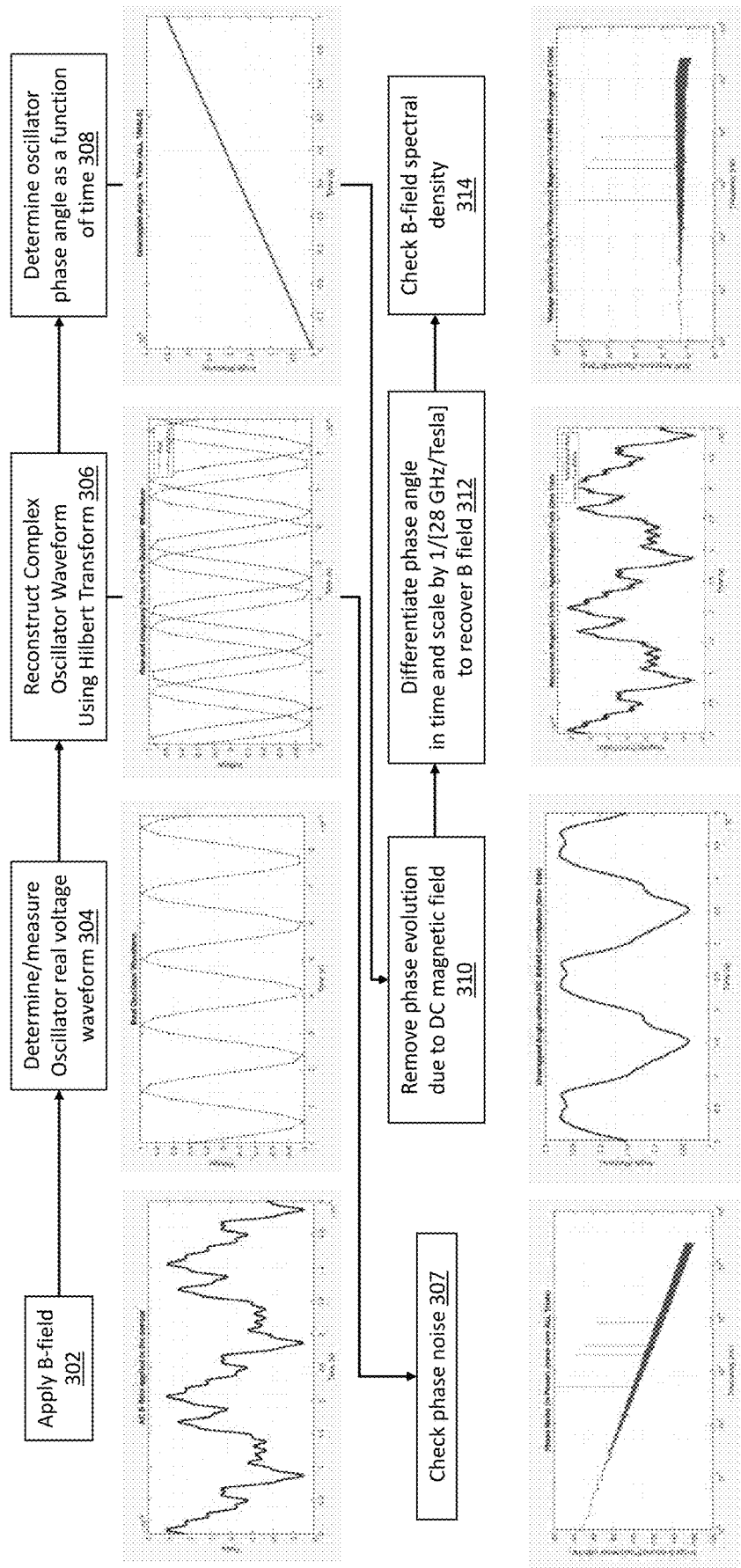
FIG. 3A shows a process for recovering the AC magnetic field measured with a ferrimagnetic oscillator magnetometer from the oscillator voltage waveform with simulated data.
Figure 3B:
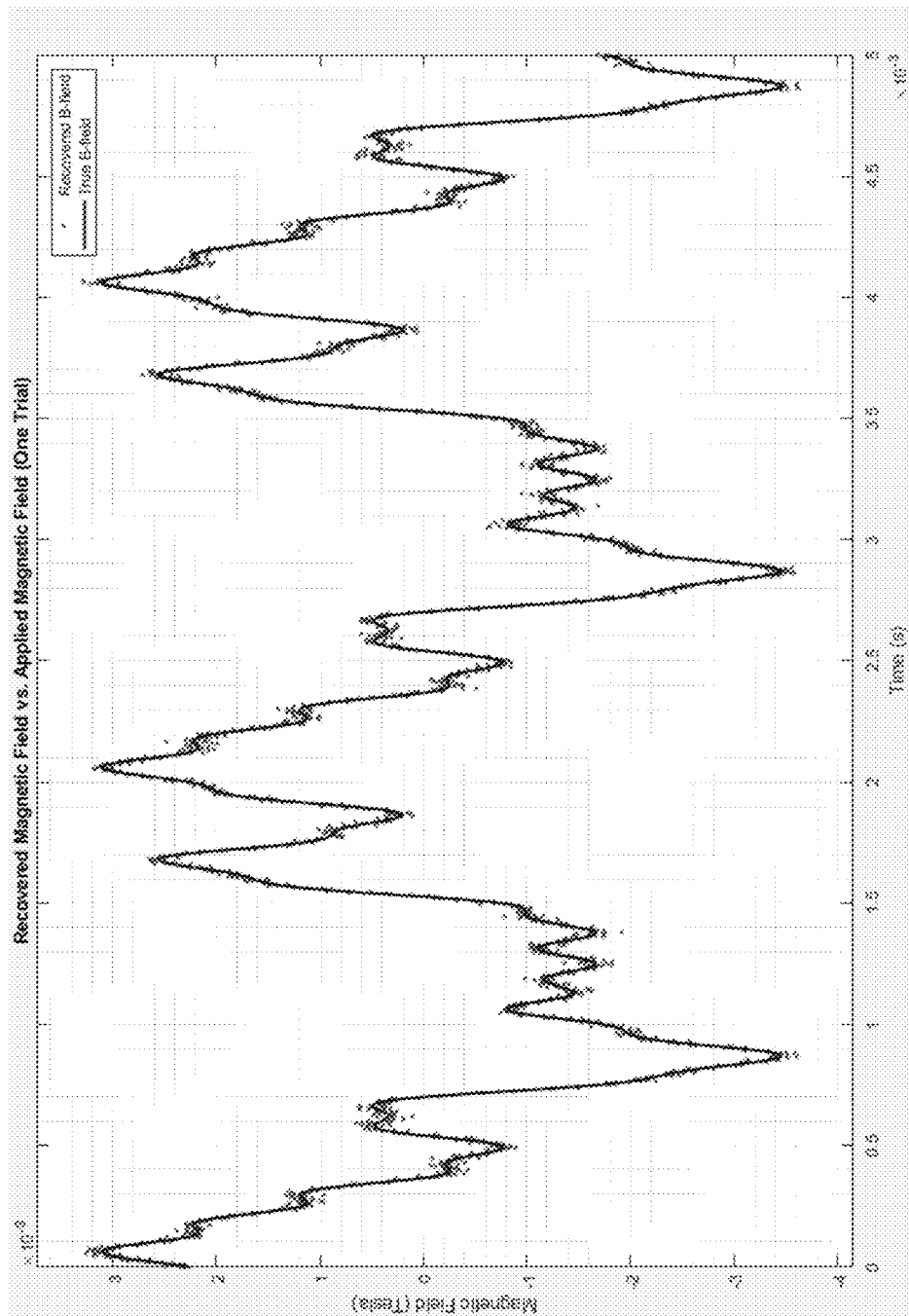
FIG. 3B shows a sample AC magnetic field waveform recovered from an oscillator waveform using the process of FIG. 3A.

FIG. 3A illustrates a process for determining the AC magnetic field amplitude from the instantaneous phase of the real voltage waveform oscillating in a ferrimagnetic oscillator magnetometer according to the steps laid out above. (The plot below each box in FIG. 3A shows a simulated representative waveform corresponding to that step of the process.) Applying a magnetic field to the ferrimagnetic oscillator magnetometer (302) produces a real oscillator voltage waveform whose instantaneous phase varies with the magnetic field amplitude as described above. This voltage waveform can be digitized and measured (304), then Hilbert-transformed to reconstruct the complex waveform (306), which can be used to check the phase noise (307) and to determine the oscillator phase angle as a function of time (308). Removing the phase evolution caused by the DC (bias) magnetic field (310) and differentiating the phase angle in time and scaling the amplitude of the result (312) yields the measured AC magnetic field amplitude. FIG. 3B shows that this recovered magnetic field waveform is consistent with true magnetic field waveform to within sensitivity/noise of the device. If desired, the recovered magnetic field waveform can be Fourier transformed to yield the power spectral density of the AC magnetic field (314).

Experimental Measurements with a Transmission-Geometry Ferrimagnetic Oscillator

The sensitivity of a magnetometer may be determined from the magnetometer response to a known applied field along with the measured noise. Because AC magnetic fields are encoded by the oscillator magnetometer as frequency modulation of its roughly 5 GHz output waveform, the measured phase noise may limit the magnetic sensitivity of the device.

FIG. 4A shows measured single-sideband phase-noise power spectral density $\mathcal{L}(f_m)$ for the ferrimagnetic oscillator magnetometer of FIG. 1A. The device can operate with a phase noise of −122.5 dBc/Hz at 10 kHz offset and −148.5 dBc/Hz at 100 kHz offset. Fitting Eqn. (1) to the single-sided phase noise to the phase-noise data gives $f_L = 800$ kHz, F=2, and $f_c = 80$ kHz (with the measured $P_s = -3$ dBm during operation). The fit value of $f_L$ is consistent with the value expected from the measured loaded linewidth of the ferrimagnetic resonance transmission filter element. The noise factor F=2 is consistent with the manufacturer-specified wideband noise figure of 3 dB.

FIG. 4B shows the predicted and measured frequency response of the ferrimagnetic oscillator magnetometer of FIG. 1A to a 150 nT rms AC magnetic field applied along the 2 axis. The predicted response is calculated according to Eqn. (4). A sinusoidal magnetic field with rms amplitude $B_{sen}^{rms} = 150$ nT was applied to the sensor, the angular frequency $\omega_m$ was varied, and the carrier-normalized amplitude of the resulting sidebands is recorded. The data are in excellent agreement with Eqn. (4), as shown in FIG. 4B.

FIG. 4C shows the device sensitivity spectrum as derived from the device response in FIG. 4B. As noted above, the sensitivity should be approximately flat in the region between the amplifier noise corner at $f_c \approx 80$ kHz and the Leeson frequency $f_L \approx 800$ kHz. The measured data are consistent with this expectation; for AC signals of known phase, the minimum sensitivity is 140 fT/$\sqrt{Hz}$ and the sensitivity is below 300 fT/$\sqrt{Hz}$ over the band from 10 kHz to 1 MHz. For AC signals of unknown phase, the sensitivity may be degraded by a factor of $\sqrt{2}$ compared to the spectrum shown in FIG. 4C.

The ferrimagnetic oscillator magnetometer disclosed and demonstrated here provides the best sensitivity achieved to date for a solid-state quantum magnetometer, with sensitivity surpassed only by cryogenic SQUID magnetometers and vacuum-based vapor cell magnetometers. Improved device sensitivity may come either from increasing the signal for a given magnetic field or from decreasing the phase noise. Increased signal may be realized by employing strong cavity coupling schemes which, under certain conditions, could allow the device frequency response versus magnetic field to be increased beyond $\gamma = 2\pi \times 28$ GHz/T (see Eqn. (2)).

The device phase noise can be reduced as well. For example, the sustaining power $P_s$ can be increased, though this approach may not reduce phase noise much, if at all, at frequencies below $f_c$ (and $f_c$ itself may increase with larger values of $P_s$). The sustaining power $P_s$ may be limited by instabilities caused by non-linear coupling of the uniform precession mode to undesired spin wave modes.

Another approach is to reduce the sustaining amplifier's contribution to phase noise. The amplifier's principal noise contributions are flicker noise below $f_c$ and wideband noise described by its noise figure. Amplifier-induced noise can be partially mitigated using oscillator-narrowing techniques such as Pound-Drever-Hall locking, carrier suppression interferometric methods, careful design, or other methods. However, in the absence of technical noise sources (such as amplifier noise), an idealized oscillator magnetometer should exhibit the same sensitivity as an idealized transmission interferometer magnetometer. That is, oscillator-narrowing techniques may not reduce phase noise to the thermal noise limit (−177 dBm/Hz at room temperature) expected in the absence of Leeson gain (and in the absence of technical noise sources). While lowering the Leeson frequency $f_L$ should improve phase noise performance, the thermal noise gain introduced by the Leeson effect appears to be fundamental to the oscillator architecture.

Finally, the encoding of the signal in frequency rather than amplitude may allow additional techniques developed for precision timekeeping to be harnessed for improved performance. Indeed, the mature state of clock technology is already taken advantage of in the device to some extent. For example, down conversion can be done by mixing the oscillator magnetometer output with the reference signal provided by an oscillator of superior phase noise.

In conclusion, the magnetometer design reported here offers a unique combination of state-of-the-art sensitivity (with realistic prospects for improvement), high dynamic range, compactness, and low power requirements. These advantages could drive widespread adoption of similar quantum sensing devices soon. The oscillator architecture can be adapted to simplify high-performance ensemble sensing with a range of quantum materials and in a variety of sensing modalities, such as sensing of electric fields, temperature, or pressure.

Ferrimagnetic Oscillator Magnetometer with Pound-Galani Architectures

FIG. 5A shows a ferrimagnetic oscillator magnetometer 200 in a Pound-Galani oscillator architecture with feedback. Like the magnetometer 100 in FIG. 1A, this magnetometer 200 includes a ferrimagnetic crystal 210 arranged in a transmission loop with a sustaining amplifier 220 and a directional coupler 230. It also includes a feedback loop that generates a Pound-Drever-Hall (PDH) error signal 261. This error signal 261 allows the magnetometer 200 to follow the center frequency of ferrimagnetic resonance more closely. This can substantially improve sensitivity, e.g., by a factor of up to 100 at certain frequencies.

The magnetometer 200 includes coupling loops 212 that couple a microwave (MW) signal 211 into and out of ferrimagnetic crystal 210. This ferrimagnetic crystal 210 is subject to a bias magnetic field from a bias magnet 214 and has a ferrimagnetic resonance whose center frequency varies with the applied magnetic field. The directional coupler 230 taps a portion of the microwave signal 211 out of the transmission loop as a MW output 231, which is digitized by a digitizer 240 for demodulation as described below. An optional bandpass filter 224 (e.g., with a passband that is about 100 MHz wide) between the through port of the directional coupler 230 and the input to the sustaining amplifier 220 suppresses noise and prevents the magnetometer 200 from oscillating at frequencies not related to the desired ferrimagnetic resonance frequency.

The feedback loop is implemented with a modulation source 270, such as an RF synthesizer, that generates a continuous-wave (CW) microwave signal. This signal drives a phase modulator 272 that is coupled in the main transmission loop between the output of the sustaining amplifier 220 and right before the first port of a three-port circulator 260. The second port of the three-port circulator 260 is coupled to the input coupling loop 212 to the ferrimagnetic crystal 210 and the third port of the three-port circulator 260 is coupled to an amplitude detector 262, which is shown in FIG. 5A as a diode. The output of the amplitude detector 262 feeds the RF port of a mixer 264, which mixes the output with another copy of the CW microwave signal from the modulation source 270. A low-pass filter 266 filters the down-converted IF output to produce an error signal 261. A proportional-integral-derivative (PID) controller 268 uses this error signal 261 to drive another phase modulator 274 to servo the error to zero. This feedback causes the oscillator's output frequency (i.e., the frequency of the MW output 231) to follow the center frequency of the ferrimagnetic resonance more tightly.

FIG. 5B illustrates how the magnetic field amplitude is encoded in the PDH error signal 261. When the oscillation frequency exactly coincides with the ferrimagnetic resonance frequency, the PDH error signal 261 is zero. When the oscillation frequency is different from the ferrimagnetic resonance, the error signal 261 is generated with a value proportional to the difference between the oscillation frequency and the ferrimagnetic resonance frequency.

Reflection-Geometry Ferrimagnetic Oscillator Magnetometer

FIGS. 6A and 6B illustrate a reflection-geometry ferrimagnetic oscillator magnetometer 300 and its equivalent circuit, respectively. In this geometry, a ferrimagnetic crystal 310 (here, a YIG sphere) is subject to a bias magnetic field from a permanent magnet 314. The ferrimagnetic crystal 310 is also inductively coupled to the emitter e of a bipolar junction transistor (BJT) 320 via an inductive coupling loop 312. The ferrimagnetic crystal 310 can be modeled as a resistor, capacitor, and inductor coupled in parallel to the inductive coupling loop 312 as shown in FIG. 6B. The collector c of the BJT 320 is coupled to a digitizer 340 via an impedance-matching element or network 330. As in the transmission geometry, applying an external magnetic field to the ferrimagnetic crystal 310 shifts the resonance of an ensemble of entangled electronic spins in the ferrimagnetic crystal. This shift modulates sidebands onto a microwave signal reflected by the ferrimagnetic crystal 310 to the BJT 320 and coupled by the BJT 320 to the digitizer 340 for digitization and detection.

Measurements with a Reflection-Geometry Ferrimagnetic Oscillator Magnetometer

FIGS. 7A-7C illustrate a ferrimagnetic oscillator magnetometer device 400 made with the reflection geometry illustrated in FIGS. 6A and 6B. FIG. 7A shows an exploded view of the magnetometer 400, which includes a ferrimagnetic oscillator 402 and circuit board 404. In this case, the ferrimagnetic crystal in the ferrimagnetic oscillator 402 is a ferrimagnetic YIG sphere 410 with a diameter of about 400 µm mounted on the end of a beryllia rod 416 near a gold coupling wire. The coupling gold wire couples the ferromagnetic sphere 410 to the emitter of a BJT 420, which is mounted on the circuit board 404 and contained within a cylindrical housing 406. A disk-shaped end cap 408 at one end of the cylindrical housing 406 supports the circuit board 404 and electrical connections to the digitizer. A 25 mm long NdFeB magnet 414 is located within the cylindrical housing 406 in front of the YIG sphere. The magnet 414 has a skin depth of approximately 1.7 mm at 100 kHz and applies a bias magnetic field to the YIG sphere.

The ferrimagnetic oscillator magnetometer 400 draws 300 mW of power (not including the digitizer's power consumption) and occupies a volume of 86 cm³ (not including the digitizer). It can sense AC magnetic fields with a sensitivity of 427 fT/√Hz at 100 kHz. It was used to measure a 214 pT root-mean-square (RMS) magnetic field at 100 kHz generated by a coil 61 inches away with a 25.5 mm radius and 30 turns. The RMS current through the coil was 65 mA as measured by an RMS current meter. The coil is oriented to create a magnetic field at the YIG sphere 410 along the longitudinal axis of the cylinder, or sensor axis (the most favorable direction).

FIG. 7D is a plot of the phase and amplitude noise of the magnetometer in FIGS. 7A-7C. The magnetometer's frequency output is fed into a phase noise analyzer. The analyzer uses the cross-correlation method to evaluate the phase noise of the device under test (here, the ferrimagnetic oscillator magnetometer). As the principal noise source in the ferrimagnetic oscillator magnetometer is phase noise, measurement of device phase noise allows a largely complete characterization of the device performance. With the known 214 pT RMS magnetic field applied to the ferrimagnetic oscillator magnetometer, the device measures a signal of −79 dBc at 100 kHz offset from the carrier (data not shown). As shown in FIG. 7D, the residual phase noise of the device is −133 dBc at 100 kHz. Therefore, the power SNR is 54 dB. The magnetometer noise is then 214 pT/√Hz reduced by $10^{54/20}=501$), which results in a measured sensitivity of η=427 fT/√Hz for fields at 100 kHz. This sensitivity is roughly in line with the sensitivity estimated from the phase noise and the expected signal from the equations above.

For the YIG oscillator in FIGS. 7A-7C, the value of γ is fixed at 2π×2.8 MHz/Gauss (the electron gyromagnetic ratio). This implies that that reducing the YIG oscillator's phase noise should improve the YIG oscillator's performance. For example, increasing the quality factor from about 500 (the estimated quality factor) to a theoretical (and practical) limit of about 10,000. Likewise, the sustaining amplifier's noise corner can be reduced from 200 kHz to 1 kHz or lower. An optimized free-running oscillator may operate with a phase noise of about 30 fT/√Hz. The phase noise can also be substantially reduced (e.g., by up to about 50 dB) by employing feedback (e.g., in a Pound-Drever-Hall arrangement as in FIG. 5A) instead of a free-running oscillator.

Coherent Averaging of Frequency-Encoded Magnetic Field Measurements

For signals encoded in an amplitude (e.g., a DC voltage level) the RMS uncertainty of the voltage amplitude after N independent measurements limited by an additive noise source (e.g., Johnson noise, digitizer read noise, etc.) varies as $\delta V/\sqrt{N}$, where δV is the RMS additive voltage noise on a single measurement. Reducing the measurement uncertainty by a factor of ten implies averaging for one hundred times longer. Unfortunately, averaging like this is not an effective way to combat additive noise sources for a device with a 100% duty cycle because the device is always on so its time-per-measurement cannot be increased.

For a magnetic field measurement encoded in the oscillation frequency of a ferrimagnetic oscillator magnetometer, however, the scaling is markedly different. The frequency uncertainty δf scales approximately proportional to $\delta V/(V N^{3/2})$, where N is the number of samples and V is the amplitude of the sinusoidal signal. Qualitatively, this scaling can be understood as follows: The accumulated signal in each frequency bin increases linearly with time (and therefore number of samples), while the noise bandwidth in each frequency bin decreases as 1/T, where T is the total sampling time, resulting in an RMS noise per bin proportional to $1/\sqrt{T}$. Together, these two effects result in the observed scaling of frequency uncertainty as $1/T^{3/2}$. As T is proportional to N, the uncertainty also scales as $1/N^{3/2}$ where N is the number of samples. FIG. 8 shows experimental data confirming this scaling for a ferrimagnetic oscillator magnetometer.

Generally, the digitizer signal-to-noise ratio (SNR) per sample does not vary terribly quickly as sampling rate is increased. For a thermal-noise-limited digitizer, voltage SNR decreases by √2 for every doubling of the sampling rate (i.e., thermally limited read noise δV is proportional to $\sqrt{F_s}$ where $F_s$ is the sampling rate). Combining the $1/N^{3/2}$ scaling with samples with the $\sqrt{F_s}$ scaling of δV with digitizer sampling rate $F_s$ shows the frequency noise from additive noise sources then varies as 1/Fs. The upside of this approach, called coherent processing, is that if a device is limited by additive or read noise, increasing the sampling rate can suppress this additive noise (at least until the digitizer's clock jitter becomes the limiting factor). Thus, because a ferrimagnetic oscillator magnetometer encodes its output in a frequency, it has a massive noise performance advantage over magnetometers than encode their outputs in amplitude (voltages) or phase.

Ferrimagnetic Crystal Anisotropy

Due to the Coulomb interaction, the wavefunctions of unpaired electrons within the lattice of a ferrimagnetic crystal may deviate from those of an isolated atom. The distorted spatial wavefunctions couple to the spin via the spin-orbit interaction, breaking the isotropy of the spin Hamiltonian. This anisotropy affects how readily the ferrimagnetic crystal magnetizes along a given direction (giving rise to easy and hard magnetization axes) and introduces a direction-dependent term into the ferrimagnetic resonance frequency. Although the general calculation of ferrimagnetic resonance frequency for arbitrary applied magnetic field is somewhat involved, it is instructive to examine a simpler case where the external magnetic field is confined to lie in the {110} plane. Under these conditions, the uniform mode resonant frequency differs from $\omega_y = \gamma B$ and is instead given to good approximation by $$\omega_y = \gamma \left[ B + \frac{K_1}{\mu_0 M_s} \left( 2 + \frac{15}{2} \sin^4\theta - 10\sin^2\theta \right) \right],$$

where $\theta$ is the angle in the {110} plane between the <100> crystallographic axis and the externally applied magnetic field, and $$\frac{K_1}{\mu_0 M_s} \approx -4.3 mT$$

for YIG.

It follows that the alignment of <111> parallel to B, as disclosed here, should result in a resonant frequency higher than $\gamma B$ by $\approx 2\pi \times 160$ MHz, while alignment of the hard axis <100> should result in a resonance lower by about $2\pi \times 240$ MHz. The dependence of the ferrimagnetic resonance frequency on $\kappa_1/M_s$ is removed for $\theta = \text{ArcSin} \sqrt{(10-2\sqrt{10})/15} \approx 29.67°$. As the anisotropic contribution to the ferrimagnetic resonance frequency is additive, anisotropy-induced frequency shifts should not alter the device response to AC magnetic fields beyond the changes in $\theta$ introduced by components of $B_{sen}$ perpendicular to $B_0$. There may be higher-order anisotropic effects, but these effects should be negligible for YIG.

Projected Fundamental Sensitivity Limits for a Spin Magnetometer

The spin-projection-limited magnetic sensitivity $\eta_{spl}$ for a spin-based DC magnetometer is $$\eta_{spl} \approx \frac{\hbar}{g_e \mu_B} \frac{1}{\sqrt{NT_2^*}},$$

where N is the number of total spins and $T_2^*$ is the free induction decay time (i.e., dephasing time). Importantly, Eqn. (13) assumes the N spins are independent. In YIG, there are $4.22 \times 10^{21}$ unit formula of $Y_3Fe_5O_{12}$ per $cm^3$, with each unit formula contributing 5 unpaired electrons. For a 1 mm diameter YIG sphere at room temperature, the number of unpaired spins is $N=8 \times 10^{18}$. For a full-width half-maximum (FWHM) unloaded linewidth of $2\pi \times 560$ kHz ($T_2^* \approx 570$ ns), the spin-projection-limited magnetic sensitivity is $\eta_{spl} = 2.7$ aT$\sqrt{s}$.

The relevance of this expression as a measure of the fundamental limits of a ferrimagnetic magnetometer remains unclear, as the strong coupling of nearby spins in a ferrimagnet violates the assumption of independent spins. Indeed, the extremely low spin-projection limit calculated for YIG highlights that the limits of this type of magnetometer likely should be understood quite differently than those of its paramagnetic counterparts. While the coupling present in ferrimagnets may allow entanglement-enhanced sensing schemes which surpass the limit imposed by Eqn. (13), other expressions may emerge with further study that produce less optimistic fundamental limits. In practice, the coupling between spins may produce limits on the power that can be applied to probe the resonance, as this coupling gives rise to degenerate spin wave modes coupled to the uniform precession resonance.

Errors Introduced by Finite Bias Field Magnitude

Nominally, a ferrimagnetic oscillator magnetometer measures the projection of the external magnetic field $B_{sen}$ along the direction of the bias magnetic field $B_0$ created by the bias magnet(s) (e.g., bias magnetics 114 in FIG. 1A), allowing the ferrimagnetic oscillator magnetometer to operate as a vector magnetometer. However, slight errors are introduced by components of $B_{sen}$ orthogonal to the bias magnetic field $B_0$. We analyze the origin and magnitude of this error here.

FIG. 9 shows the total field applied to the sensor can be represented as the vector sum of the bias field from the permanent magnet, which has an amplitude $B_0$ along the $\hat{z}$ direction (i.e., $B_0 = B_0 \hat{z}$), and the field to be sensed, $B_{sen}$: $B = B_0 + B_{sen}$. (The MW magnetic field applied at the ferrimagnetic resonance frequency is assumed to oscillate rapidly compared to the sensing bandwidth, so that the MW field contributes negligibly to the effective total magnetic field.)

Although the magnetometer in fact measures the scalar field, it produces an effective vector measurement. To see how, consider the external field as $B_{sen} = B_{sen}^{\parallel} + B_{sen}^{\perp}$, where $B_{sen}^{\parallel}$ and $B_{sen}^{\perp}$ are the external field components parallel and perpendicular to $B_0$, respectively. The scalar field is then $$|B| = \sqrt{B \cdot B}$$
$$= \sqrt{(B_0 + B_{sens}^{\parallel})^2 + (B_{sens}^{\perp})^2}$$
$$= B_0 \sqrt{\left(1 + \frac{B_{sens}^{\parallel}}{B_0}\right)^2 + \left(\frac{B_{sens}^{\perp}}{B_0}\right)^2}$$
$$= B_0 \sqrt{1 + 2\frac{B_{sens}^{\parallel}}{B_0} + \left(\frac{B_{sens}^{\parallel}}{B_0}\right)^2 + \left(\frac{B_{sens}^{\perp}}{B_0}\right)^2}.$$

Taylor expanding the final expression above with $B_{sen} \ll B_0$ yields $$|B| \approx B_0 + B_{sens}^{\parallel} + \frac{(B_{sen}^{\perp})^2}{2B_0}.$$

The third term in the above expansion provides an estimate of the error, $$\text{Error} \approx \frac{(B_{sen}^{\perp})^2}{2B_0}.$$

The maximum error occurs when $B_{sen}$ is oriented perpendicular to the z axis. The error is minimized when $B_{sen}$ is parallel to the z-axis. For a 0.05 mT external field and $B_0 = 0.178$ T, the maximal error is 7 nT.

These errors may be suppressed (e.g., by a factor of 1000 or more) by assembling a full vector magnetometer out of three ferrimagnetic oscillator magnetometers oriented in different (e.g., orthogonal) directions. In this configuration, the measured values from each of the three sensors can be combined to refine the reconstructed magnetic field vector, though this procedure may impose restrictions on the allowable magnetic field gradient (depending on how closely co-located the three sensors can be).

YIG Magnetometer Noise

As detailed above, a single-frequency AC magnetic field applied to the sensor results in frequency modulation of the oscillator's carrier at angular frequency $\omega_m$. In the frequency domain, this modulation manifests as two sidebands offset by $\pm\omega_m$ from the oscillator's carrier frequency, each with carrier-normalized amplitude $\gamma B_{sen}^{rms}/(\sqrt{2}\omega_m)$. Magnetic field detection then reduces to resolving these two sidebands from the oscillator's measured phase noise. The magnetic sensitivity $\eta(f_m)$ may be written as a ratio between the phase noise spectral density $\mathcal{L}^{1/2}(f_m)$ and the signal due to these FM sidebands, each with carrier-normalized amplitude $\gamma B_{sen}^{rms}/(\sqrt{2}\omega_m)$. Thus, the sensitivity is $$\eta(f_m) = \frac{f_m}{\gamma/(2\pi)} \times \mathcal{L}^{\frac{1}{2}}(f_m) \quad (14)$$

where $\mathcal{L}^{1/2}(f_m)$ is the single-sided phase-noise spectral density of the oscillator. With optimal (synchronous) detection, the SNR is improved by $\sqrt{2}$ over that expected from a single sideband and a B-field of unknown phase; this factor has been applied to Eqn. (14). For realistic oscillators, the phase noise is symmetric about the carrier, and thus there is no improvement to be gained by processing both the upper and lower sideband.

It is informative to apply Leeson's model of oscillator phase noise to Eqn. (14). Leeson's equation for the single-sided phase noise of an oscillator as a function of the offset frequency $f_m$ from the carrier is given by $$\mathcal{L}^{\frac{1}{2}}(f_m) = \sqrt{\frac{1}{2}\left[\frac{f_L^2}{f_m^2}+1\right]\left[\frac{f_c}{f_m}+1\right]\left[\frac{Fk_BT}{P_s}\right]}, \quad (15)$$

where $f_L \equiv (½)(\kappa_L/2\pi)$ denotes the Leeson frequency, $f_c$ is the observed noise corner of the sustaining amplifier under operating conditions, $P_s$ is the sustaining power (i.e., the input to the sustaining amplifier), T is the temperature (assumed for simplicity to be the same for both the amplifier and the resonator), $k_B$ is Boltzmann's constant, and F denotes the wideband noise factor of the sustaining amplifier. Here, $\kappa_L$ is an angular frequency FWHM while $f_L$ is a non-angular frequency half-width. Combining Eqns. (14) and (15) yields an expected sensitivity of $$\eta(f_m) = \frac{f_m}{\gamma/(2\pi)}\sqrt{\frac{1}{2}\left[\frac{f_L^2}{f_m^2}+1\right]\left[\frac{f_c}{f_m}+1\right]\left[\frac{Fk_BT}{P_s}\right]}. \quad (16)$$

Eqn. (16) illustrates that sensitivity should be at a minimum for magnetic fields at frequencies $f_m$ satisfying $f_c < f_m < f_L$. In this region, both the signal and the noise scale as roughly $1/f_m$, resulting in an approximately flat frequency response. For the measurements disclosed here, $f_c$=80 kHz and $f_L$=800 kHz, with the best sensitivity between those two frequencies. At frequencies below $f_c$ or above $f_L$, sensitivity is reduced due to various effects. At frequencies near or below $f_c$, the flicker noise of the amplifier (as well as other effects such as thermal drift of the ferrimagnetic resonance or vibration) increases the oscillator phase noise relative to the signal. For frequencies near or above the Leeson frequency $f_L$, sensitivity may be compromised because the phase noise is independent of $f_m$ while the signal response decreases at 20 dB/decade as $f_m$ increases.

If $f_m$ additionally satisfies $f_c \ll f_m \ll f_L$, Eqn. (16) may be simplified to $$\eta \approx \frac{1}{2\sqrt{2}}\frac{\kappa_L}{\gamma}\sqrt{\frac{Fk_BT}{P_s}}.$$

Setting F=1 in Eqn. (16) yields a sensitivity equivalent to that of an idealized (that is, with ideal amplifier and thermally noise limited), optimally coupled ($\kappa_1 = \kappa_2 = \kappa_0/2$, assuming an ideal amplifier) transmission interferometer.

This reflects what appear to be fundamental limits of oscillator phase noise. Quantitatively, the Leeson effect dictates that $$S_\varphi(f) = \left[1 + \frac{f_L^2}{f^2}\right]S_\psi(f),$$

where $S_\psi(f)$ is the one-sided power spectral density of additive phase shifts inside the oscillator loop, and $S_\varphi(f)$ denotes the one-sided power spectral density of the oscillator's output phase noise. As thermal noise produces a lower bound on $S_\psi(f)$ and the effect of this noise on $S_\varphi(f)$ is effectively enhanced for frequencies below $f_L$, the intuition that a device can reach the naive thermal phase noise limit (−177 dBm/Hz) for frequencies below $f_L$ may be incorrect, regardless of any oscillator narrowing techniques that may be used. The same limits are observed in interferometric frequency discriminators.

Ferrimagnetic Gradiometer

FIG. 10 shows a gradiometer 1000 that uses two ferrimagnetic oscillator magnetometers 1002a and 1002b (collectively, magnetometers 1002) to measure the gradient of an external magnetic field. These ferrimagnetic oscillator magnetometers 1002a and 1002b can be implemented as separate devices, as in FIG. 10, or as different ferrimagnetic crystals subject to the same bias field from the same permanent magnet. In either case, the magnetometers' analog outputs 1003a and 1003b (collectively, analog signals 1003) (e.g., from the coupler 130 in FIG. 1A or the BJT collector c in FIG. 6A) are mixed with an analog mixer 1004 to produce an intermediate frequency (IF) signal that is digitized with a digitizer 1006. As explained above, the magnetometers' analog outputs 1003 are modulated with sidebands whose amplitudes are proportional to the applied magnetic field. A magnetic field gradient across the magnetometers 1002 causes the magnetometers 1002 to produce outputs 1003 with different sidebands. When mixed, these sidebands produce an IF beat proportional to the magnetic field gradient.

TABLE 1

Variables and Parameters for Ferrimagnetic Oscillator Magnetometers

| Name | Symbol | Approx. value | Units |
|---|---|---|---|
| Gyromagnetic ratio | $g_e$ | ≈2 | unitless |
| Bohr magneton | $\mu_B$ | $9.274 \times 10^{-24}$ | J/T |
| Vacuum permeability | $\mu_0$ | $1.257 \times 10^{-16}$ | H/m |
| Boltzmann constant | $k_B$ | $1.381 \times 10^{-23}$ | J/K |
| Gyromagnetic ratio | $\gamma$ | $\approx 2\pi \times 28 \times 10^9$ | $rad \cdot s^{-1} T^{-1}$ |
| System temperature | T | | Kelvin |
| Amplifier wideband noise factor | F | | unitless |
| Amplifier flicker noise corner | $f_c$ | | Hz |
| Amplifier input (sustaining) power | $P_s$ | | W |
| Intrinsic linewidth | $\kappa_0$ | | rad/s |
| Input coupling rate | $\kappa_1$ | | rad/s |
| Output coupling rate | $\kappa_2$ | | rad/s |
| YIG resonant frequency | $\omega_y$ | | rad/s |
| MW drive frequency | $\omega_d$ | | rad/s |
| Oscillator carrier frequency | $\omega_c$ | | rad/s |
| Intermediate frequency | $\omega_i$ | | rad/s |
| Loaded linewidth | $\kappa_L = \kappa_0 + \kappa_1 + \kappa_2$ | | rad/s |
| Loaded quality factor | $Q_L = \omega_y/\kappa_L$ | | unitless |
| Unloaded quality factor | $Q_0 = \omega_y/\kappa_0$ | | unitless |
| Leeson frequency | $f_L = \kappa_L/(2 \times 2\pi)$ | | Hz |
| S-parameters | $S_{11}, S_{12}, S_{21}, S_{22}$ | | unitless |
| Total magnetic field | $B = B_0 + B_{sen}$ | | Tesla |
| Bias magnetic field | $B_0 = B_0 \hat{z}$ | | T |
| Test sensing magnetic field | $B_{sen}(t)$ | | T |
| Test sensing magnetic field rms amplitude | $B_{sen}^{rms}$ | | T |
| Test sensing magnetic field angular frequency | $\omega_m = 2\pi f_m$ | | rads/s |
| Test sensing magnetic field frequency | $f_m = \omega_m/(2\pi)$ | | Hz |
| Demagnetization factors | $N_x, N_y, N_z$ | | unitless |
| Saturation magnetization | $M_s$ | | A/m |
| Single-sideband phase noise power spectral density | $\mathcal{L}(f_m)$ | | dBc/Hz |
| Single-sideband phase noise spectral density | $\mathcal{L}^{1/2}(f_m)$ | | $dBc/\sqrt{Hz}$ |
| Time | t | | s |
| Oscillator voltage waveform | v(t) | | V |
| Oscillator voltage waveform amplitude | $V_0$ | | V |
| Oscillator instantaneous phase | $\phi(t)$ | | rads |
| Oscillator additive phase (noise or signal) | $\varphi(t)$ | | rads |
| Oscillator additive amplitude noise | $\alpha(t)$ | | unitless |
| Line impedance | $Z_0$ | | Ohms |
| Transformer turn ratios | $n_1, n_2$ | | unitless |
| Magnetic sensitivity at frequency $f_m$ | $\eta(f_m)$ | | $T/\sqrt{Hz}$ |

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of," or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A magnetometer comprising:
   a ferrimagnetic crystal comprising an ensemble of entangled electronic spins, the ensemble of entangled electronic spins having a resonance that shifts in response to an external magnetic field;
   a sustaining amplifier, in electrical communication with the ferrimagnetic crystal, to amplify a microwave signal modulated by a shift in the resonance of the ensemble of entangled electronic spins; and
   a digitizer, in electrical communication with the sustaining amplifier and/or the ferrimagnetic crystal, to digitize the microwave signal.

2. The magnetometer of claim 1, wherein the ferrimagnetic crystal and the sustaining amplifier are connected in a transmission geometry.

3. The magnetometer of claim 1, wherein the ferrimagnetic crystal and the sustaining amplifier are connected in a reflection geometry.

4. The magnetometer of claim 1, wherein the sustaining amplifier comprises a bipolar junction transistor.

5. The magnetometer of claim 1, further comprising:
   a bandpass filter, in electromagnetic communication with an input of the sustaining amplifier, to filter the microwave signal.

6. The magnetometer of claim 1, further comprising:
   a bias magnet, in electromagnetic communication with the ferrimagnetic crystal, to apply a bias magnetic field to the ensemble of entangled electronic spins.

7. The magnetometer of claim 1, wherein the shift in the resonance varies linearly with an amplitude of the external magnetic field.

8. The magnetometer of claim 1, wherein the shift in the resonance modulates sidebands onto the microwave signal with amplitudes proportional to an amplitude of the external magnetic field at offset frequencies proportional to an oscillation frequency of the external magnetic field.

9. The magnetometer of claim 8, wherein the magnetometer has a sensitivity versus the oscillation frequency of the external magnetic field that is substantially constant for $f_c < f_m < f_L$, where is the oscillation frequency of the external magnetic field, $f_c$ is an observed noise corner of the sustaining amplifier, and $f_L$ is the Leeson frequency of the magnetometer.

10. The magnetometer of claim 1, further comprising:
    an input coupling loop, inductively coupled to the ferrimagnetic crystal, to couple the microwave signal into the ferrimagnetic crystal; and
    an output coupling loop, inductively coupled to the ferrimagnetic crystal, to couple the microwave signal out of the ferrimagnetic crystal.

11. The magnetometer of claim 10, further comprising:
    a directional coupler having an input port coupled to the output coupling loop, a through port coupled to an input of the sustaining amplifier, and a tap port coupled to the digitizer.

12. The magnetometer of claim 1, further comprising:
    a feedback loop, in electromagnetic communication with the ferrimagnetic crystal and the sustaining amplifier, to generate and apply an error signal correcting an error between a frequency of the microwave signal and a center frequency of the resonance.

* * * * *